(12) United States Patent
Lee et al.

(10) Patent No.: US 11,387,201 B2
(45) Date of Patent: Jul. 12, 2022

(54) CHIP PACKAGE AND MANUFACTURING METHOD THEREOF

(71) Applicant: XINTEC INC., Taoyuan (TW)

(72) Inventors: Po-Han Lee, Taipei (TW); Chia-Ming Cheng, New Taipei (TW); Jiun-Yen Lai, Taoyuan (TW); Ming-Chung Chung, Taoyuan (TW); Wei-Luen Suen, Taoyuan (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 17/023,199

(22) Filed: Sep. 16, 2020

(65) Prior Publication Data

US 2021/0082841 A1 Mar. 18, 2021

Related U.S. Application Data

(60) Provisional application No. 62/901,502, filed on Sep. 17, 2019.

(51) Int. Cl.
*H01L 23/66* (2006.01)
*H01L 23/00* (2006.01)
*H01L 23/552* (2006.01)
*H01L 21/3213* (2006.01)

(52) U.S. Cl.
CPC .......... *H01L 23/66* (2013.01); *H01L 21/3213* (2013.01); *H01L 23/552* (2013.01); *H01L 24/05* (2013.01); *H01L 24/29* (2013.01); *H01L 24/83* (2013.01); *H01L 2223/6677* (2013.01); *H01L 2224/0231* (2013.01)

(58) Field of Classification Search
CPC ... H01L 2224/6677; H01L 2224/05548; H01L 2224/0231
See application file for complete search history.

(56) References Cited

U.S. PATENT DOCUMENTS

| 8,760,342 B2 * | 6/2014 | Hayata | H01L 23/66 342/175 |
| 2009/0289345 A1 * | 11/2009 | Tsai | H01L 27/14618 438/106 |
| 2014/0071021 A1 * | 3/2014 | Liu | H01L 21/50 343/893 |
| 2015/0230333 A1 * | 8/2015 | Yoda | B41J 2/1646 216/13 |

FOREIGN PATENT DOCUMENTS

| CN | 107958896 | 4/2018 |
| CN | 108695292 | 10/2018 |
| TW | 201622503 | 6/2016 |

\* cited by examiner

*Primary Examiner* — Dale E Page
*Assistant Examiner* — Wilner Jean Baptiste
(74) *Attorney, Agent, or Firm* — Liu & Liu

(57) ABSTRACT

A chip package includes a semiconductor substrate, a supporting element, an antenna layer, and a redistribution layer. The semiconductor substrate has an inclined sidewall and a conductive pad that protrudes from the inclined sidewall. The supporting element is located on the semiconductor substrate, and has a top surface facing away from the semiconductor substrate, and has an inclined sidewall adjoining the top surface. The antenna layer is located on the top surface of the supporting element. The redistribution layer is located on the inclined sidewall of the supporting element, and is in contact with a sidewall of the conductive pad and an end of the antenna.

34 Claims, 23 Drawing Sheets

CHIP PACKAGE AND MANUFACTURING METHOD THEREOF

RELATED APPLICATION

This application claims priority to U.S. Provisional Application Ser. No. 62/901,502, filed Sep. 17, 2019, which is herein incorporated by reference in its entirety.

BACKGROUND

Field of Invention

The present invention relates to a chip package and a manufacturing method of the chip package.

Description of Related Art

In wireless communication devices, antennas are a component for sending and receiving radio signals on radio waves, and are one of the important components of the wireless communication devices. As wireless communication technology develops, wireless communication devices are designed towards the trends of light weight and reduced size.

However, generally speaking, the antennas still need to be electrically connected to the chip on the circuit board in an external method. Therefore, electronic devices (e.g., mobile phones) still need to occupy a certain disposed space, which is disadvantageous for miniaturization.

SUMMARY

An aspect of the present invention is to provide a chip package.

According to an embodiment of the present invention, a chip package includes a semiconductor substrate, a supporting element, an antenna layer, and a redistribution layer. The semiconductor substrate has an inclined sidewall and a conductive pad. The conductive pad protrudes from the inclined sidewall. The supporting element is located on the semiconductor substrate. The supporting element has a top surface facing away from the semiconductor substrate, and has an inclined sidewall adjacent to the top surface. The antenna layer is located on the top surface of the supporting element. The redistribution layer is located on the inclined sidewall of the supporting element, and is in contact with a sidewall of the conductive pad and an end of the antenna.

In an embodiment of the present invention, the chip package further includes a shielding layer. The shielding layer is located between the semiconductor substrate and the supporting element.

In an embodiment of the present invention, the supporting element has a bottom surface opposite to the top surface. The shielding layer is in contact with the bottom surface.

In an embodiment of the present invention, the antenna layer is in contact with the top surface of the supporting element.

In an embodiment of the present invention, the semiconductor substrate has a bottom surface adjacent to the inclined sidewall. The chip package further includes a planarization layer. The planarization layer covers the inclined sidewall and the bottom surface of the semiconductor substrate. The planarization layer covers a bottom surface of the conductive pad. The planarization layer has a bottom surface and an inclined sidewall adjacent to the bottom surface. A slope of the inclined sidewall of the planarization layer is substantially equal to a slope of the inclined sidewall of the supporting element.

In an embodiment of the present invention, the redistribution layer is located on the inclined sidewall and the bottom surface of the planarization layer.

In an embodiment of the present invention, transmission frequency of the antenna layer is in range from 20 GHz to 60 GHz. The semiconductor substrate is a radio frequency device.

In an embodiment of the present invention, the chip package further includes a protective layer. The protective layer covers the supporting element, the antenna layer, and an end of the redistribution layer facing away from the semiconductor substrate.

In an embodiment of the present invention, the protective layer is made of a material that includes glass, fused silica, silica glass, sapphire, or combinations thereof.

In an embodiment of the present invention, the protective layer is adhesive.

In an embodiment of the present invention, a cavity is formed among the supporting element, the semiconductor substrate, and the protective layer, and the supporting element surrounds the cavity.

In an embodiment of the present invention, the semiconductor substrate has a top surface adjacent to the inclined sidewall of the semiconductor substrate. The chip package further includes a shielding layer. The shielding layer is located on the top surface of the semiconductor surface.

In an embodiment of the present invention, the chip package further includes a bonding layer. The bonding layer is located between the supporting element and the semiconductor substrate.

An aspect of the present invention is to provide a manufacturing method of a chip package.

According to an embodiment of the present invention, the manufacturing method of a chip package includes forming an antenna layer on a top surface of a supporting element, bonding the supporting element to a top surface of a semiconductor substrate, wherein the top surface of the semiconductor has a conductive pad, etching a bottom surface of the semiconductor substrate such that the semiconductor substrate has an inclined sidewall, and the conductive pad protrudes from the inclined sidewall, performing a cutting process such that the supporting element has an inclined sidewall, and forming a redistribution layer on the inclined sidewall of the supporting element such that the redistribution layer is in contact with a sidewall of the conductive pad and an end of the antenna layer.

In an embodiment of the present invention, forming the antenna layer further includes sputtering a conductive layer on the top surface of the supporting element, and patterning the conductive layer to form the antenna layer.

In an embodiment of the present invention, the manufacturing method of the chip package further includes forming a shielding layer on a bottom surface of the supporting element.

In an embodiment of the present invention, forming the shielding layer includes sputtering a conductive layer on the bottom surface of the supporting element, and patterning the conductive layer to form the shielding layer.

In an embodiment of the present invention, the manufacturing method of the chip package further includes forming a planarization layer on the inclined sidewall and the bottom surface of the semiconductor substrate and a bottom surface of the conductive pad.

In an embodiment of the present invention, the cutting process is performed such that the planarization layer simultaneously forms an inclined sidewall, wherein a slope of the inclined sidewall of the planarization layer is substantially equal to a slope of the inclined sidewall of the supporting element.

In an embodiment of the present invention, the manufacturing method of the chip package further includes disposing a protective layer on the supporting element and the antenna layer.

In the aforementioned embodiments of the present invention, since the chip package includes the supporting element and the antenna layer on the top surface of the supporting element, and the semiconductor substrate has the conductive pad protruding from the inclined sidewalls thereof, the redistribution layer can be formed on the inclined sidewall of the supporting element and thus is in contact with the inclined sidewall of the conductive pad and with one end of the antenna layer. In addition, the antenna layer is formed on the top surface of the supporting element, and the supporting element is bonded to the top surface of the semiconductor substrate to be integrated into the chip package, therefore, the miniaturization of the antenna and the chip package containing the antenna are achieved.

According to an embodiment of the present invention, a chip package includes a first substrate, an antenna layer, a first passivation layer, and a redistribution layer. The first substrate has a first surface and a second surface opposite to the first surface. The antenna layer is located on the first surface of the first substrate. The first passivation layer covers the antenna layer. The redistribution layer is located on the second surface of the first substrate, and is electrically connected to the antenna layer. The redistribution layer further has a shielding section spaced apart from the antenna layer. The shielding section overlaps the antenna layer.

In an embodiment of the present invention, the redistribution layer extends to a lateral surface of the first substrate and a lateral surface of the first passivation layer.

In an embodiment of the present invention, the chip package further includes a second substrate. The first passivation layer is located between the first substrate and the second substrate, and the redistribution layer extends to a concave portion of the second substrate.

In an embodiment of the present invention, the chip package further includes a metallic layer and a second passivation layer. The metallic layer is located on a surface of the second substrate facing away from the first passivation layer. The second passivation layer covers the metallic layer.

In an embodiment of the present invention, the second substrate is made of a material that includes glass, fused silica or silica glass.

In an embodiment of the present invention, the chip package further includes a second passivation layer. The second passivation layer covers the redistribution layer.

In an embodiment of the present invention, the chip package further includes an integrated circuit component. The integrated circuit component has a conductive structure, and is located on the redistribution layer.

In an embodiment of the present invention, the first substrate is made of a material that includes glass, fused silica or silica glass.

In an embodiment of the present invention, the chip package further includes a conductive via. The conductive via is located in the first substrate, and two ends of the conductive via are respectively in contact with the antenna layer and the redistribution layer.

According to an embodiment of the present invention, the manufacturing method of a chip package includes forming an antenna layer on a first surface of a first substrate, wherein the first substrate has a second surface facing away from the first surface, forming a first passivation layer to cover the antenna layer, and forming a redistribution layer on the second surface of the first substrate, wherein the redistribution layer is electrically connected to the antenna layer. The redistribution layer further has a shielding section spaced apart from the antenna layer. The shielding section overlaps the antenna layer.

In an embodiment of the present invention, the manufacturing method of the chip package further includes bonding a second substrate to the first substrate such that the first passivation layer is located between the first substrate and the second substrate.

In an embodiment of the present invention, the manufacturing method of the chip package further includes forming a metallic layer on a surface of the second substrate facing away from the first passivation layer, and forming a second passivation layer to cover the metallic layer.

In an embodiment of the present invention, the manufacturing method of the chip package further includes removing an edge portion of the first substrate and an edge portion of the first passivation layer to form a trench, wherein a lateral surface of the antenna layer is exposed from the trench, and the trench extends into the second substrate such that the second substrate has a concave portion.

In an embodiment of the present invention, forming the redistribution layer on the second surface of the first substrate further includes forming the redistribution layer on the lateral surface of the antenna and the concave portion of the second substrate.

In an embodiment of the present invention, the manufacturing method of the chip package further includes forming a second passivation layer to cover the redistribution layer.

In an embodiment of the present invention, the manufacturing method of the chip package further includes disposing an integrated circuit component on the redistribution layer, wherein the integrated circuit component has a conductive structure.

In an embodiment of the present invention, the manufacturing method of the chip package further includes forming a conductive via in the first substrate, wherein two ends of the conductive via are respectively in contact with the antenna layer and the redistribution layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
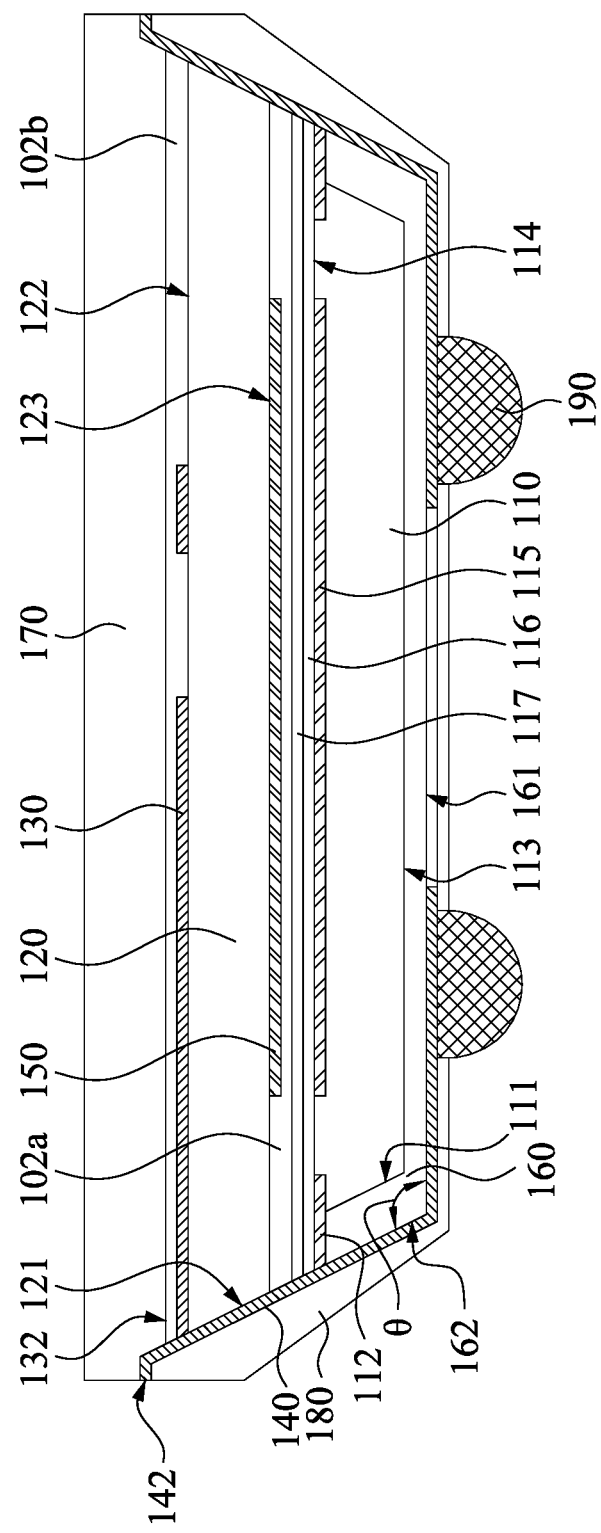
FIG. 1 is a cross-sectional view of a chip package according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a chip package 100 according to one embodiment of the present invention. The chip package 100 includes a semiconductor substrate 110, a supporting element 120, an antenna layer 130, and a redistribution layer 140. The semiconductor substrate 110 has an inclined sidewall 111 and a conductive pad 112, and the conductive pad 112 protrudes from an inclined sidewall 121. The supporting element 120 is located on the semiconductor substrate 110, and has a top surface 122 facing away from the semiconductor substrate 110 and the inclined sidewall 121 adjacent to the top surface 122. The antenna layer 130 is located on the top surface 122 of the supporting element 120. The redistribution layer 140 is located on the inclined sidewall 121 of the supporting element 120, and is in contact with a sidewall of the conductive pad 112 and an end 132 of the antenna 130.

In this embodiment, the chip package 100 can be used for high frequency signal transmission, such as 5G communication. Transmission frequency of the antenna layer 130 may be in range from 20 GHz to 60 GHz, and the semiconductor substrate 110 may be a radio frequency device. The semiconductor substrate 110 may be made of a material that includes silicon, and may have a functional layer 115. For example, the functional layer may be made of a material that includes GaN. Moreover, the semiconductor substrate 110 may cover an insulated layer 116 and a passivation layer 117 sequentially from the top surface 114, and the present invention is not limited in this regard. The redistribution layer 140 may be made of a material includes copper, silver or aluminum. The antenna layer 130 may be made of a material that includes copper or silver. The redistribution layer 140 and the antenna layer 130 can be formed by physical vapor deposition (e.g., sputtering). As a result, the antenna layer 130 can be directly in contact with the top surface 122 of the supporting element 120.

Since the chip package 100 includes the supporting element 120 and the antenna layer 130 on the top surface 122 of the supporting element 120, and the semiconductor substrate 110 has the conductive pad 112 protruding from the inclined sidewall 111 thereof, the redistribution layer 140 can be formed on the inclined sidewall 121 of the supporting element 120, and thus the sidewall of the conductive pad 112 is in contact with the end 132 of the antenna layer 130. In addition, the antenna layer 130 is formed on the top surface 122 of the supporting element 120, and the supporting element 120 is bonded on the top surface 114 of the semiconductor substrate 110 to be integrated in the chip package 100, therefore, the miniaturization of the antenna and the chip package 100 containing the antenna are achieved.

In this embodiment, the chip package 100 further includes a shielding layer 150. The shielding layer 150 is located between the semiconductor substrate 110 and the supporting element 120. The supporting element 120 has a bottom surface 123 opposite to the top surface 122. The shielding layer 150 can be formed on the bottom surface 123 of the supporting element 120 by the physical vapor deposition (e.g., sputtering). Therefore, the shielding layer 150 can be directly in contact with the bottom surface 123 of the supporting element 120. The shielding layer 150 can prevent radio frequency signals (RF) from interfering with the semiconductor substrate 110.

The semiconductor substrate 110 has a bottom surface 113. The bottom surface 113 is adjacent to the inclined sidewall 111, and is opposite to the top surface 114. The chip package 110 further includes a planarization layer 160. The planarization layer 160 covers the inclined sidewall 111 of the semiconductor 110 and the bottom surface 113 of the semiconductor 110. The planarization layer 160 also covers a bottom surface of the conductive pad 112. The planarization layer 160 has a bottom surface 161 and an inclined sidewall 162 adjacent to the bottom surface 161. And a slope of the inclined sidewall of the planarization layer 160 is substantially equal to a slope of the inclined sidewall 121 of the supporting element 120. The redistribution layer 140 is located on the inclined sidewall 162 of the planarization layer 160 and the bottom surface 161 of the planarization layer 160. That is, the redistribution layer 140 can extend to the bottom surface 161 of the planarization layer 160 through the planarization layer 160 from the inclined sidewall 121 of the supporting element 120, and thus the redistribution layer 140 has a blunt angle θ.

In addition, the chip package 100 may further include a passivation layer 180 and a conductive structure 190. The passivation layer 180 covers the redistribution layer 140 and the planarization layer 160. The passivation layer 180 may have an opening structure to be disposed at the conductive structure 190 on the bottom surface of the redistribution layer 140. The conductive structure 190 may be a solder ball or a conductive pillar, and the present invention is not limited in this regard. The conductive structure 190 can be electrically connected to other electronic devices (e.g., circuit boards).

In this embodiment, the chip structure 100 may further include a protective layer 170. The protective layer 170 covers the supporting element 120, the antenna layer 130 and an end 142 of the redistribution layer 140 facing away from the semiconductor substrate 110. The protective layer 170 may be made of a material that includes glass, fused silica, silica glass, sapphire, or combinations thereof.

Furthermore, the chip package 100 further includes two bonding layers 102a and 102b. The bonding layer 102a is located between the supporting element 120 and the semiconductor substrate 110. The bonding layer 102b is located between the supporting element 120 and the protective layer 170.

It is to be noted that the connection relationship of the aforementioned elements will not be repeated. In the following description, other types of chip structures will be described. A manufacturing method of the chip package 100 will now be described.

Figure 2:
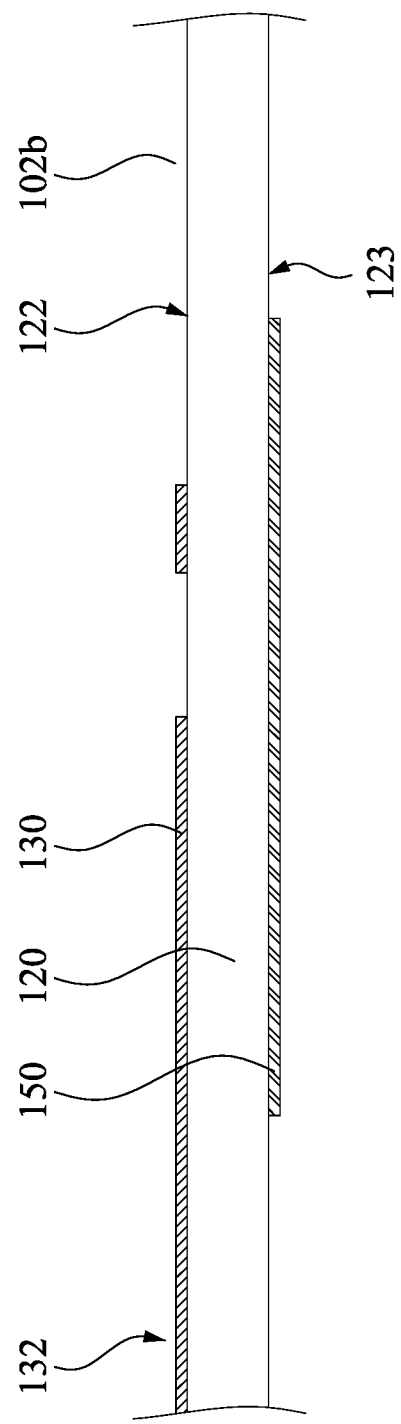
FIG. 2 to FIG. 9 are cross-sectional views at various stages of a manufacturing method of the chip package in FIG. 1.

FIG. 2 to FIG. 9 are cross-sectional views at various stages of a manufacturing method of the chip package 100 in FIG. 1. As shown in FIG. 2, first, the antenna layer 130 is formed on the top surface 122 of the supporting element 120. The process of forming the antenna layer 130 may include forming a conductive layer first (e.g., by sputtering)

on the entire top surface 122 of the supporting element 120, and patterning the conductive layer to form the antenna layer 130. The process of patterning may include exposure, development, and etching. In addition, the shielding layer 150 may be formed on the bottom surface 123 of supporting element 120. The process of forming the shielding layer 150 may include forming the conductive layer first (e.g., by sputtering) on the entire bottom surface 123 of the supporting element 120, and patterning the conductive layer to form the shielding layer 150. Through the above processes, the structure in FIG. 2 is obtained.

Figure 3:
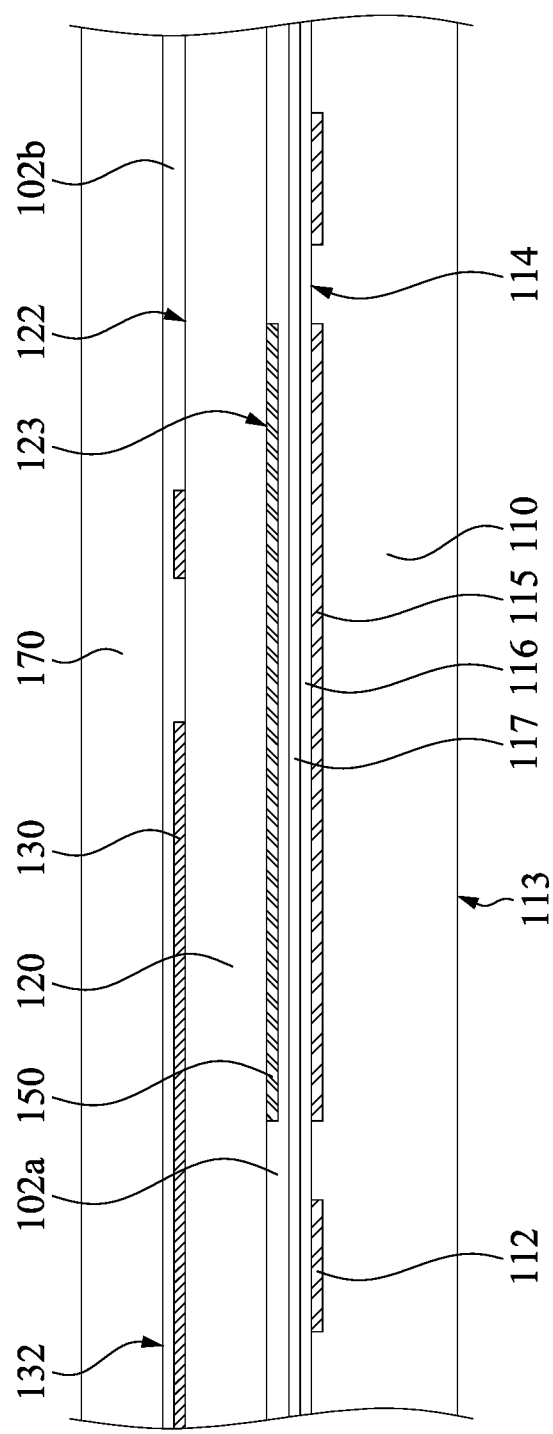

As shown in FIG. 3, the supporting element 120 may be bonded to the top surface 114 of the semiconductor 110 by the bonding layer 102a, and the protective layer 170 may be disposed on the supporting element 120 and the antenna layer 130. For example, the protective layer 170 may be bonded to the top surface 122 of the supporting element 120 by the bonding layer 102b. In one embodiment, the protective layer 170 may be bonded to the top surface 122 of the supporting element 120 first by the bonding layer 102b, and the supporting element 120 may be bonded to the top surface 114 of the semiconductor substrate 110 by the bonding layer 102a, and the present invention is not limited in this regard. The semiconductor substrate 110 in FIG. 3 to FIG. 9 is a wafer that has not undergone a dicing process so as to facilitate manufacturing.

Figure 4:
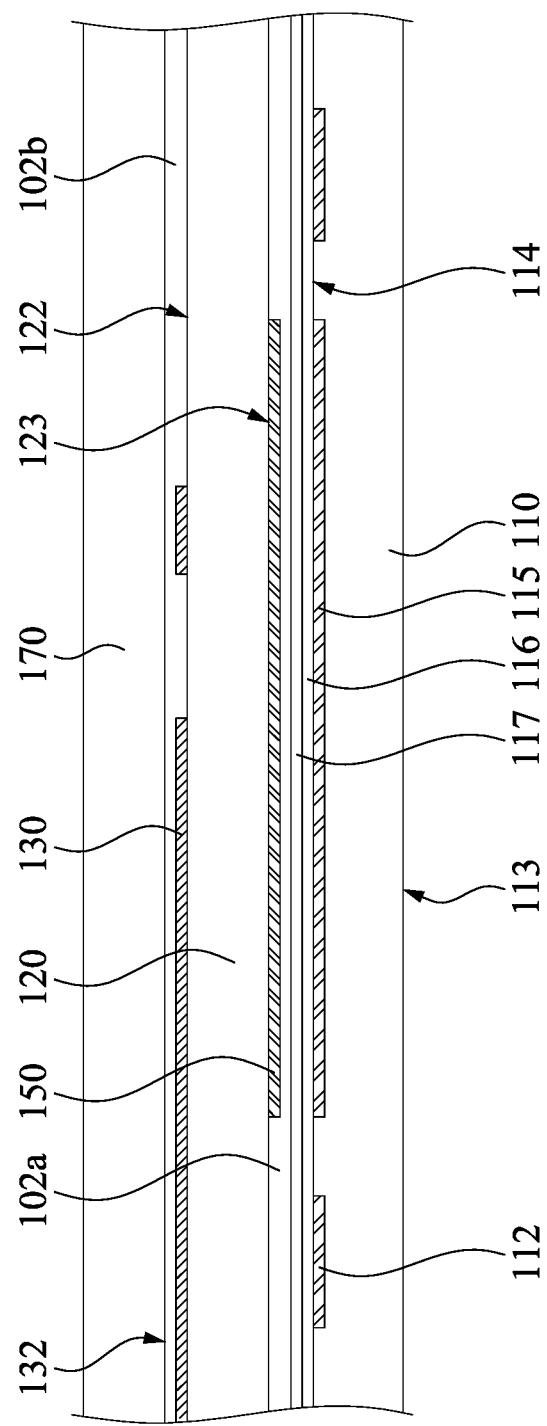

After the structure in FIG. 3 is formed, the semiconductor substrate 110 may be thinned. For example, the bottom surface 113 of the semiconductor substrate 110 may be polished. As a result, the structure of FIG. 4 is obtained.

Figure 5:
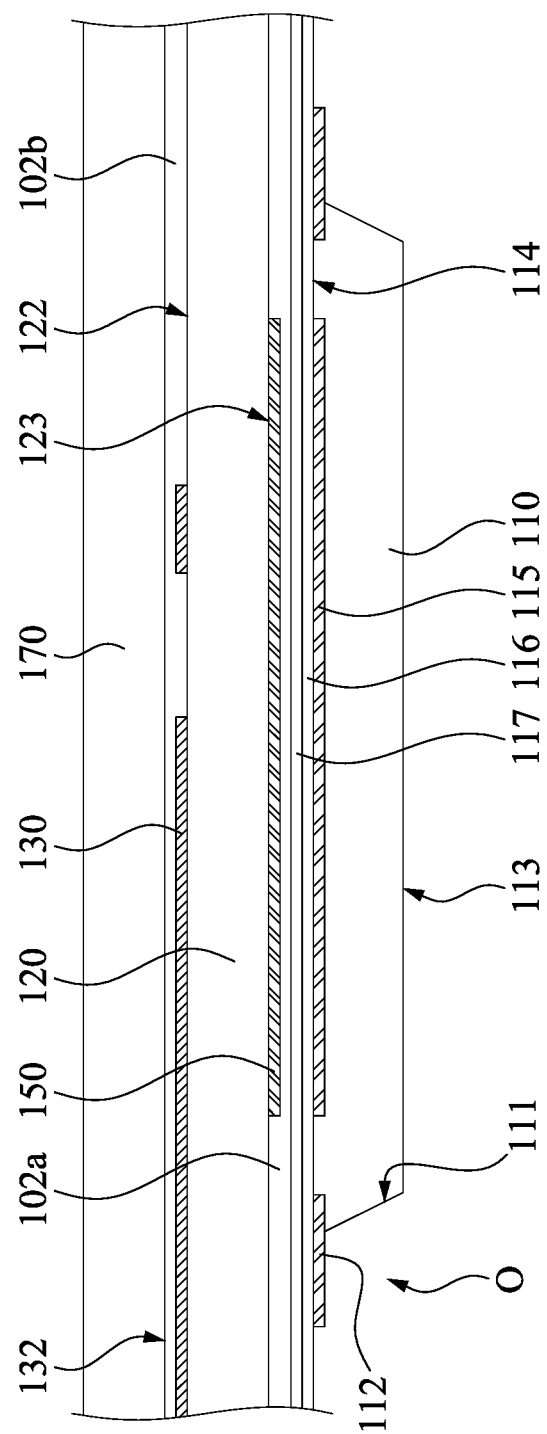

As shown in FIG. 5, next, the bottom surface 113 of the semiconductor substrate 110 may be etched such that the semiconductor substrate 110 may have an inclined sidewall 111 facing the opening O, and the conductive pad 112 may protrude from the inclined sidewall 111 and may be exposed from the opening O.

Figure 6:
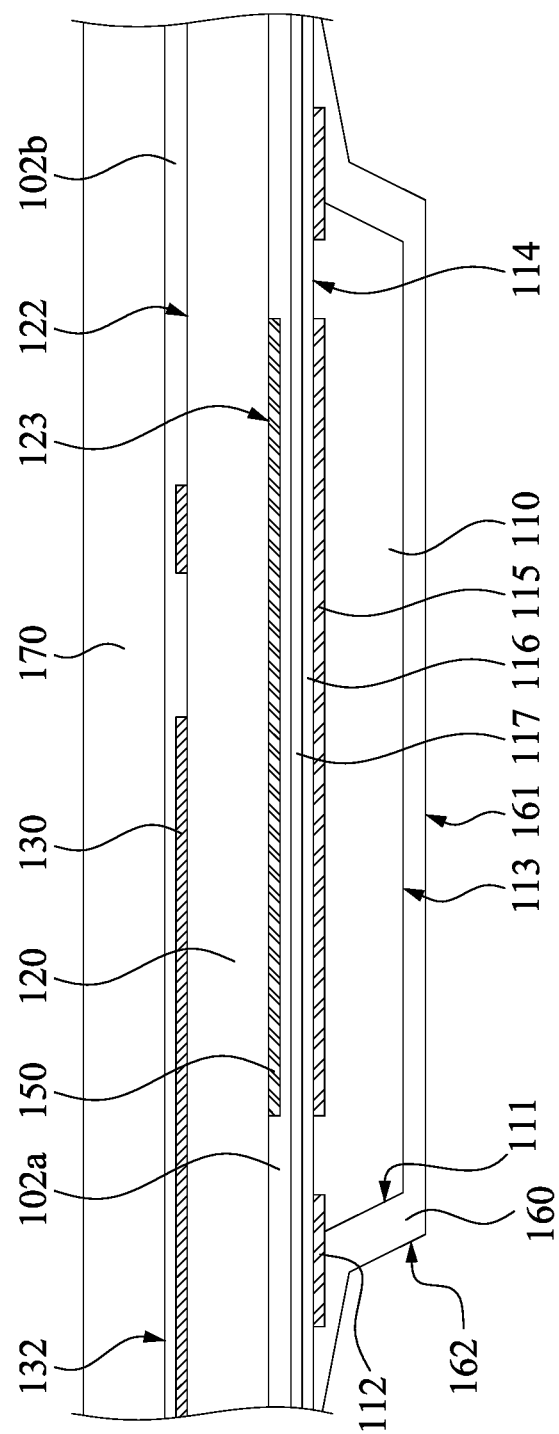

As shown in FIG. 6, after the structure in FIG. 5 is formed, the planarization layer 160 may be formed on the inclined sidewall 111 of the semiconductor substrate 110, on the bottom surface 113 of the semiconductor substrate 110, and on the bottom surface of the conductive pad 112.

Figure 7:
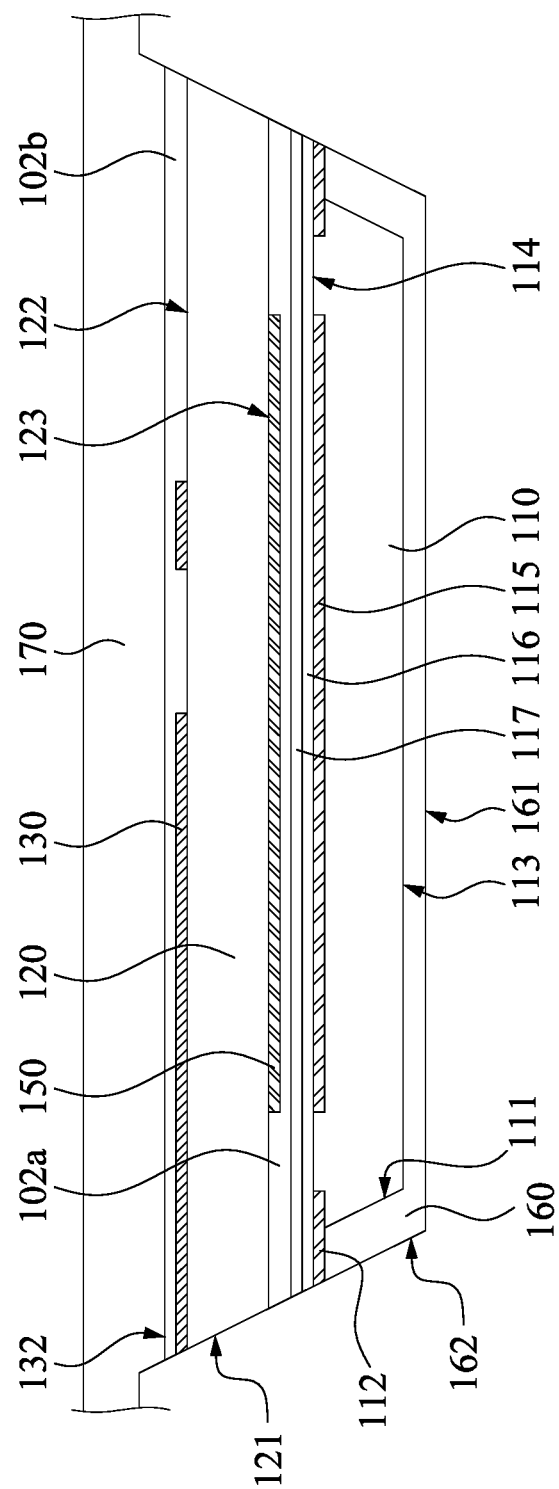

As shown in FIG. 7, next, a cutting process with a cutting tool may be performed to make the supporting element 120 may have the inclined sidewall 121. During the cutting process, the planarization layer 160 may simultaneously form the inclined sidewalls 162. Since this cutting process can be performed with a single tool, a slope of the inclined sidewall 162 of the planarization layer 160 may be substantially equal to a slope of the inclined sidewall 121 of the supporting element 120. A slope of the sidewall of the conductive pad 112 of the semiconductor substrate 110 may be substantially equal to a slope of the inclined sidewalls 121 and 162. This design benefit the stability of the subsequent redistribution layer 140 (see FIG. 8). In addition, the end 132 of the antenna layer 130 is also exposed during the cutting process.

Figure 8:
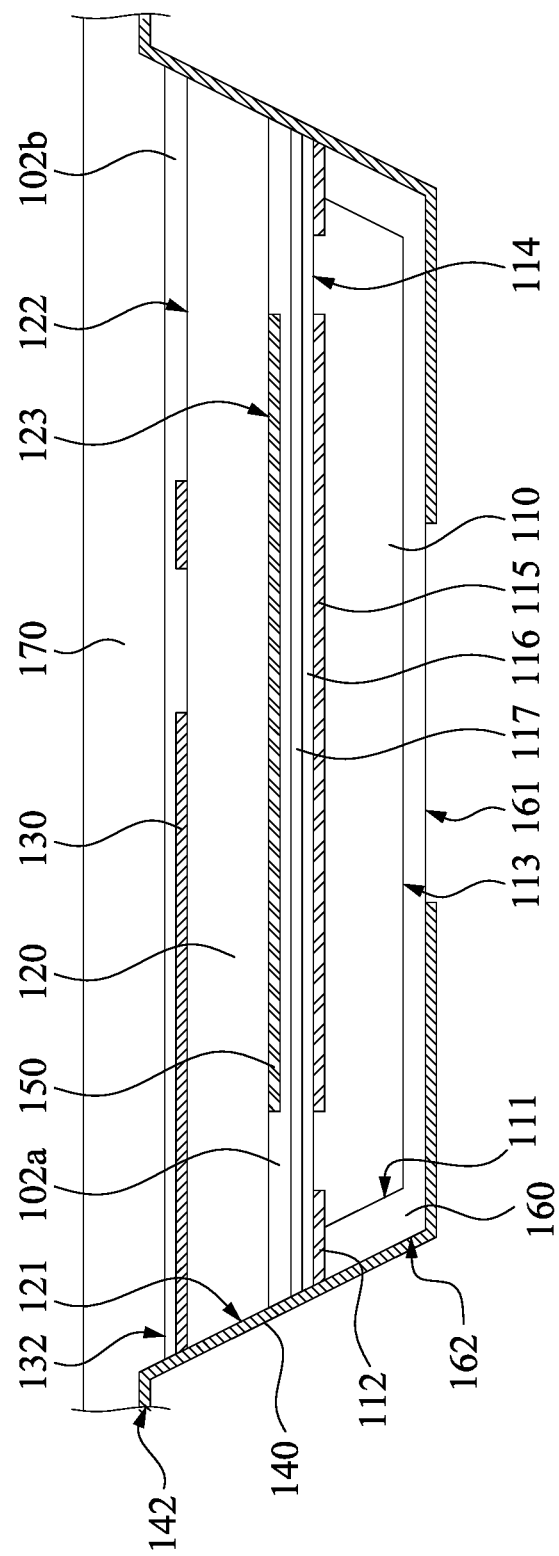

As shown in FIG. 8, after the structure in FIG. 7 is formed, the redistribution layer 140 is formed on the inclined sidewall 121 of the supporting element 120, on the sidewall of the conductive pad 112, on the inclined sidewall 162 of the planarization layer 160, and on the bottom surface 161 of the planarization layer 160. Hence, the redistribution layer 140 may be in contact with the sidewall of the conductive pad 112 and with the end 132 of the antenna layer 130 such that the semiconductor substrate 110 is electrically connected to the antenna layer 130.

Figure 9:
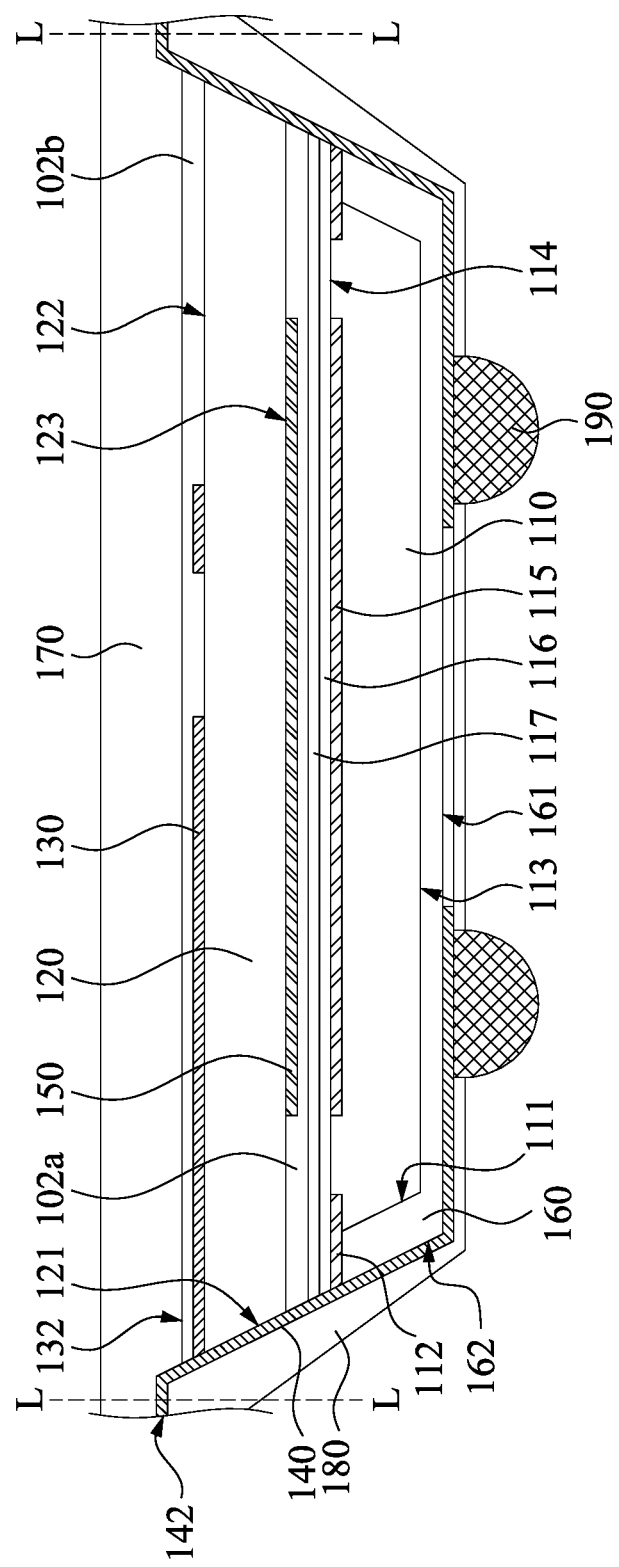

As shown in FIG. 9, in the subsequent processes, a passivation layer 180 may be formed to cover the redistribution layer 140 and the planarization layer 160. Next, the passivation layer 180 may be patterned such that the passivation layer 180 on the bottom surface 161 of the planarization layer 160 may form an opening that exposes the redistribution layer 140. Next, the conductive structure 190 may be disposed on the opening of the redistribution layer 140. The conductive structure 190 can be electrically connected to other electronic devices (e.g., circuit boards). After that, the cutting process may be performed along the line L to obtain the chip package 100 in FIG. 1.

Figure 10:
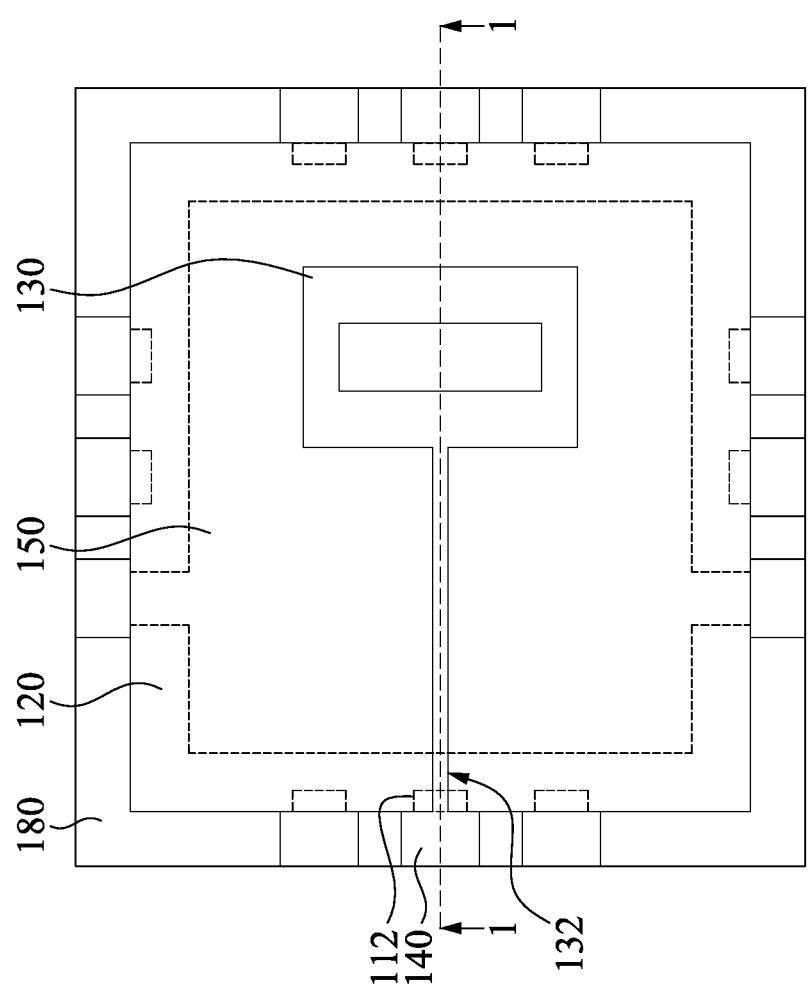
FIG. 10 is a top view of the chip package of FIG. 1, in which the protective layer and the bonding layer are omitted.
Figure 11:
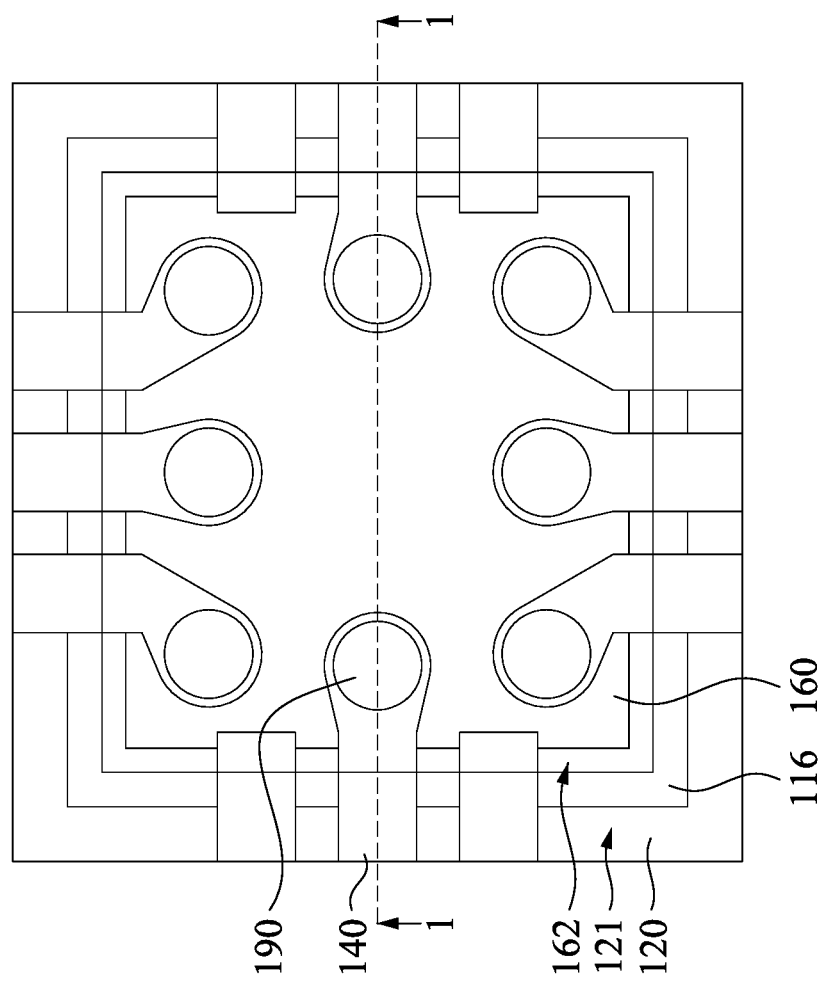
FIG. 11 is a bottom view of the chip package in FIG. 1, in which the passivation layer is omitted.

FIG. 10 is a top view of the chip package of FIG. 1, in which the protective layer 170 and the bonding layer 102b are omitted. FIG. 11 is a bottom view of the chip package in FIG. 1, in which the passivation layer 180 is omitted. FIG. 1 can be viewed as a cross-sectional view of FIG. 10 and FIG. 11 along line segment 1-1. As shown in FIG. 10 and FIG. 11, the end 132 of the antenna layer 130 and the shielding layer 150 are electrically connected to the redistribution layers 140. For example, the end 132 of the antenna layer 130 may be in contact with the left side of the redistribution layer 140 in FIG. 10, and the shielding layer 150 may be in contact with the top side and down side of the redistribution layer 140 in FIG. 10. With this disposition, the antenna layer 130 and the shielding layer 150 may be operated respectively by different sides of the redistribution layer 140 and the conductive structure 190 below them. In addition, the pattern of the antenna layer 130 in FIG. 10 is only for illustration, and the present invention is not limited in this regard.

Figure 12:
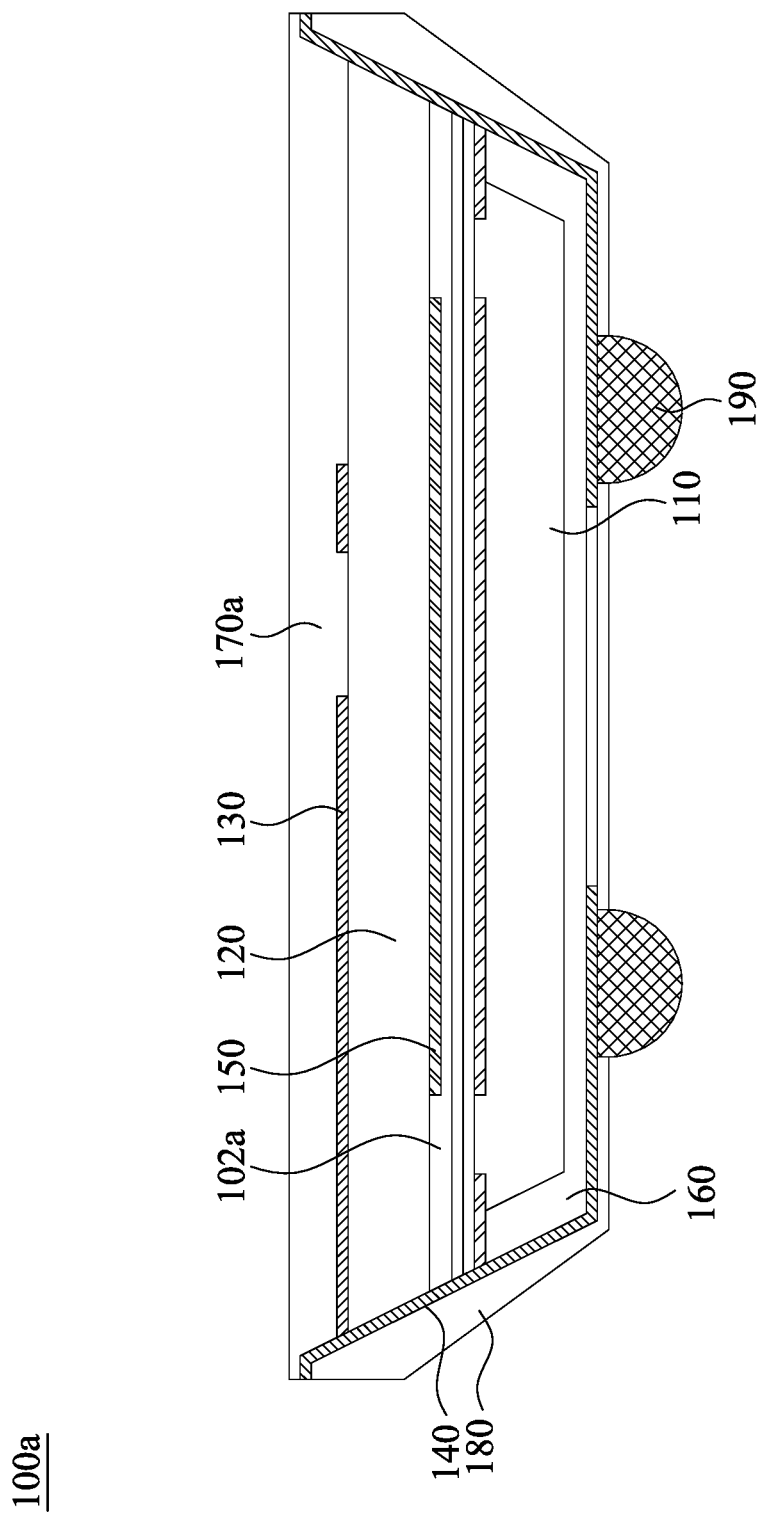
FIG. 12 is a cross-sectional view of the chip package according to one embodiment of the present invention.

FIG. 12 is a cross-sectional view of the chip package 100a according to one embodiment of the present invention. The chip package 100a includes the semiconductor substrate 110, the supporting element 120, the antenna layer 130, the redistribution layer 140, and a protective layer 170a. The difference from the embodiment in FIG. 1 is that the protective layer 170a is made of adhesive, and can replace the protective layer 170 and the bonding layer 102b in FIG. 1 to save material and manufacturing costs.

Figure 13:
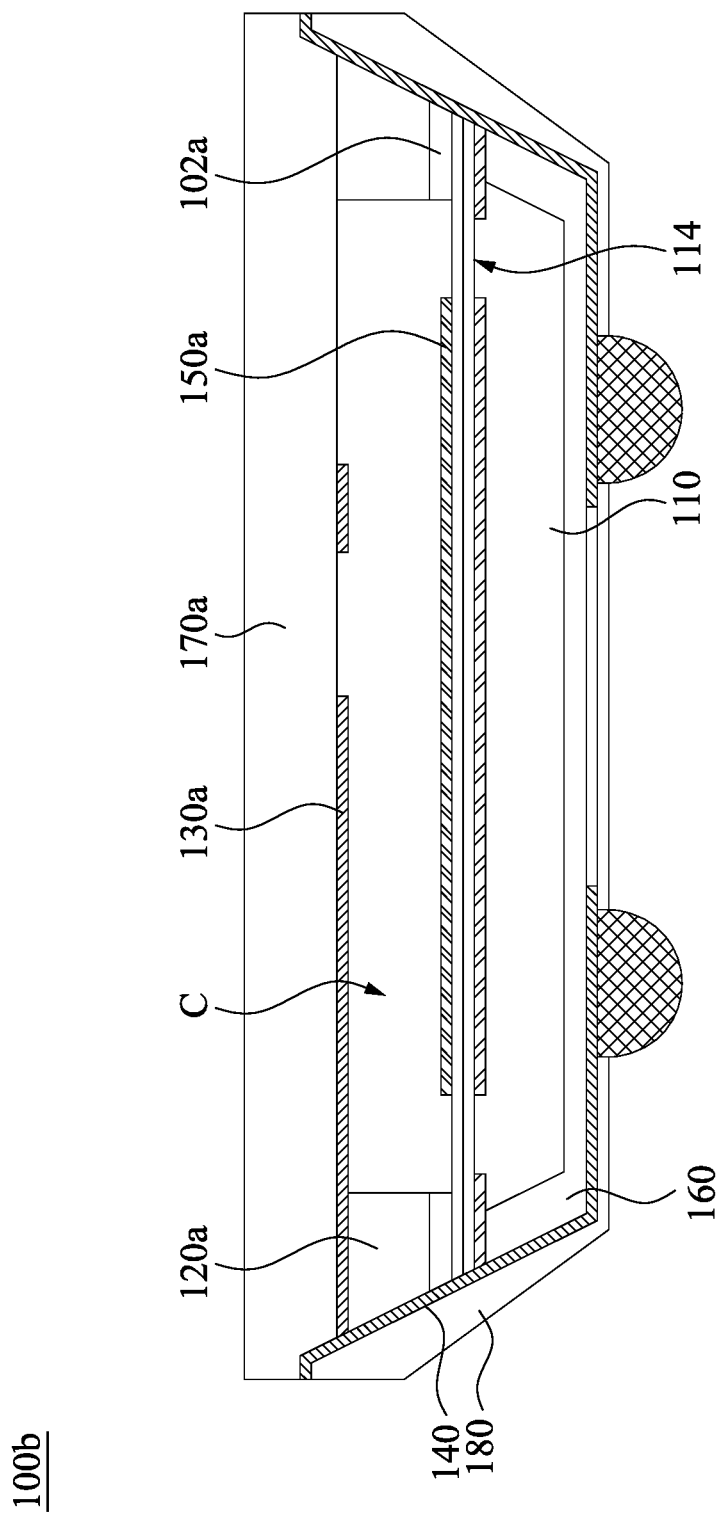
FIG. 13 is a cross-sectional view of the chip package according to one embodiment of the present invention.

FIG. 13 is a cross-sectional view of the chip package 100b according to one embodiment of the present invention. The chip package 100b includes the semiconductor substrate 110, a supporting element 120a, an antenna layer 130a, the redistribution layer 140, the shielding layer 150a and the protective layer 170a. The difference from the embodiment in FIG. 1 is that a cavity C is formed among the supporting element 120a, the semiconductor substrate 110, and the protective layer 170a, and the supporting element 120a surrounds the cavity C. In addition, a part of the antenna layer 130a faces the cavity C, and the other part faces the supporting element 120a. In this embodiment, the shielding layer 150a is located on the top surface 114 of the semiconductor substrate 110. Therefore, the cavity C is located between the shielding layer 150a and the antenna layer 130a.

Figure 14:
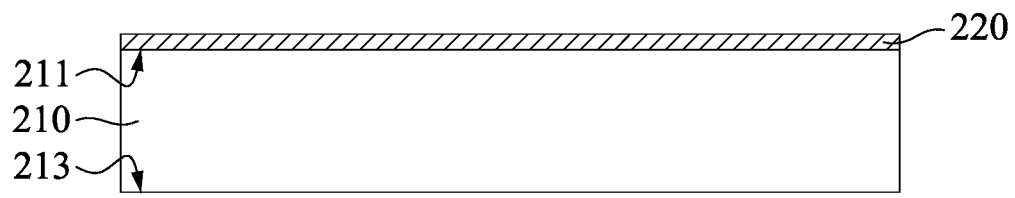
FIG. 14 to FIG. 25 are cross-sectional views at various stages of a manufacturing method of the chip package according to one embodiment of the present invention.
Figure 15:
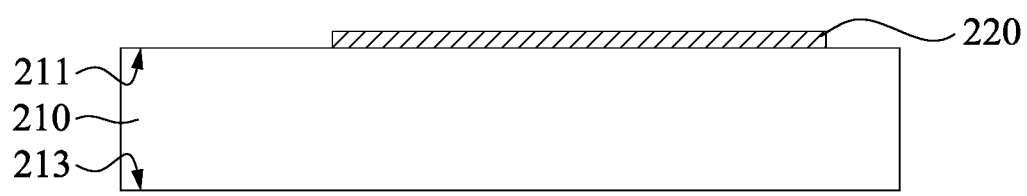

FIG. 14 to FIG. 25 are cross-sectional views at various stages of a manufacturing method of a chip package 200 (see FIG. 25) according to one embodiment of the present invention. As shown in FIG. 14 and FIG. 15, an antenna layer 220 is formed on an entire first surface 211 of a first substrate 210 by a deposition method, and the antenna layer 220 in FIG. 15 is obtained through a patterning process. In this embodiment, the antenna layer 220 may be made of a material that includes copper. The first substrate 210 may be made of a material that includes glass, fused silica or silica glass. The first substrate inside 210 may have no circuits and conductive contacts.

Figure 16:
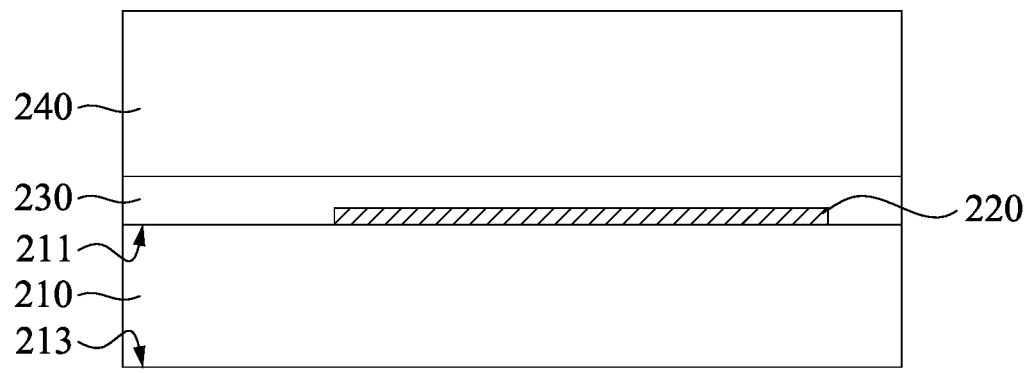

As shown in FIG. 16, after the antenna layer 220 is formed, a passivation layer 230 may be formed to cover the antenna layer 220. In this process, a second substrate 240 may be bonded to the first substrate 210 such that the passivation layer 230 may be located between the first substrate 210 and the second substrate 240. The material of the second substrate 240 may be the same as that of the first substrate 210, such as glass, fused silica, or silica glass. In addition, the passivation layer 230 is formed on the first substrate 210 or the second substrate 240 before aforementioned bonding processes, and the present invention is not limited in this regard.

Figure 17:
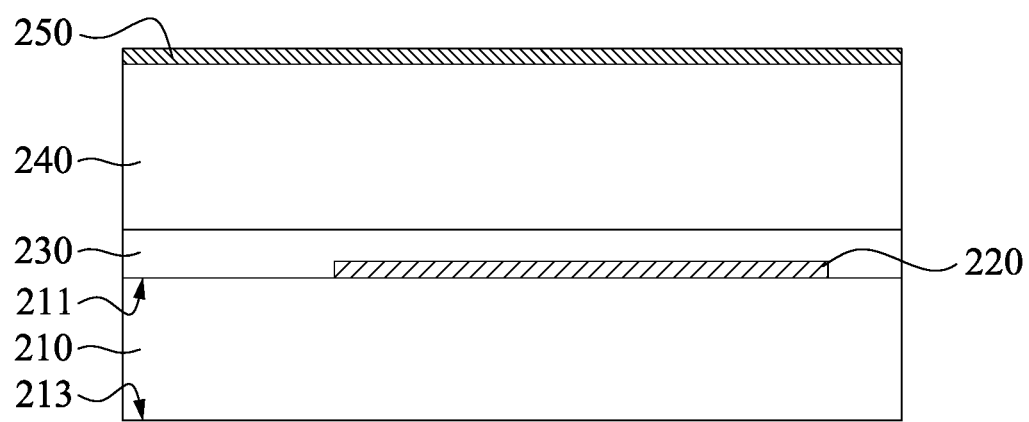
Figure 18:
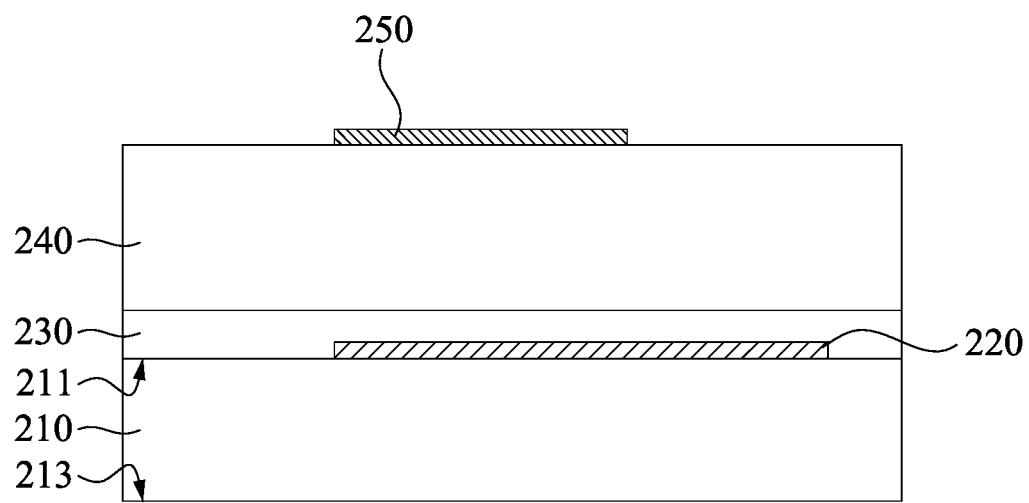

As shown in FIG. 17 and FIG. 18, after the second substrate 240 is bonded to the first substrate 210, a metallic layer 250 may be formed by the deposition method on an entire surface of the second substrate 240 facing away from the passivation layer 230. Next, a patterning process is performed to obtain the metallic layer 250 in FIG. 18. The metallic layer 250 may be made of a material that includes copper. The disposition of the metallic layer 250 is optional. In some embodiments, the chip package may not have the metallic layer 250.

Figure 19:
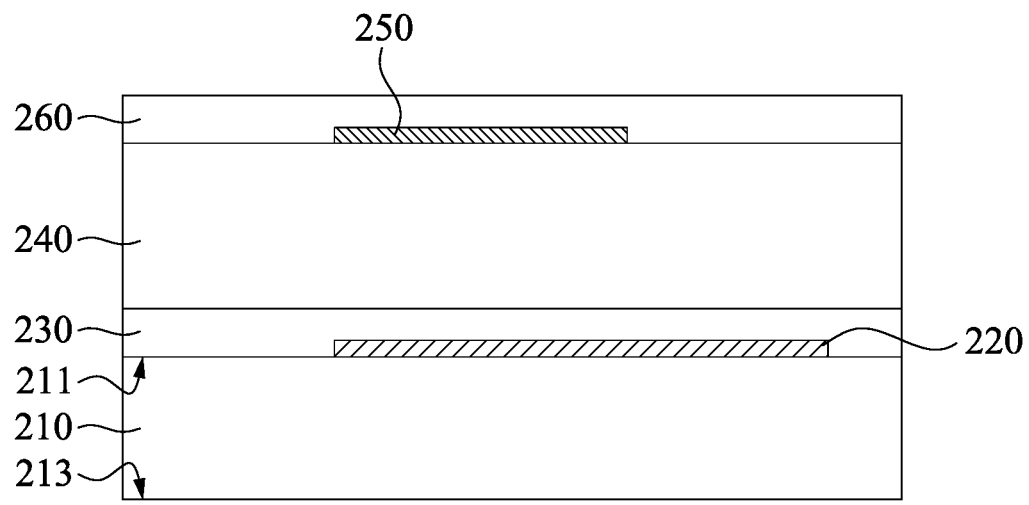

As shown in FIG. 19, after the metallic layer 250 is patterned, a passivation layer 260 may be formed to cover the metallic layer 250. The first substrate 210 may have a second surface 213 facing away from the first surface 211.

Figure 20:
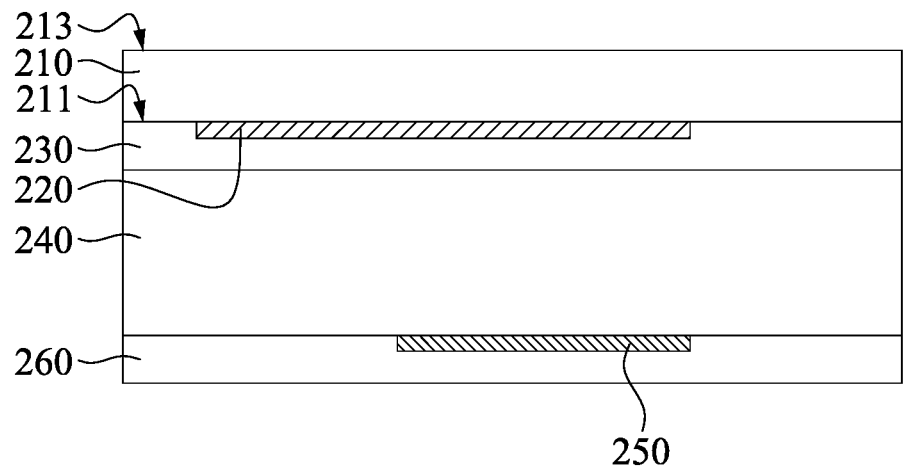
Figure 21:
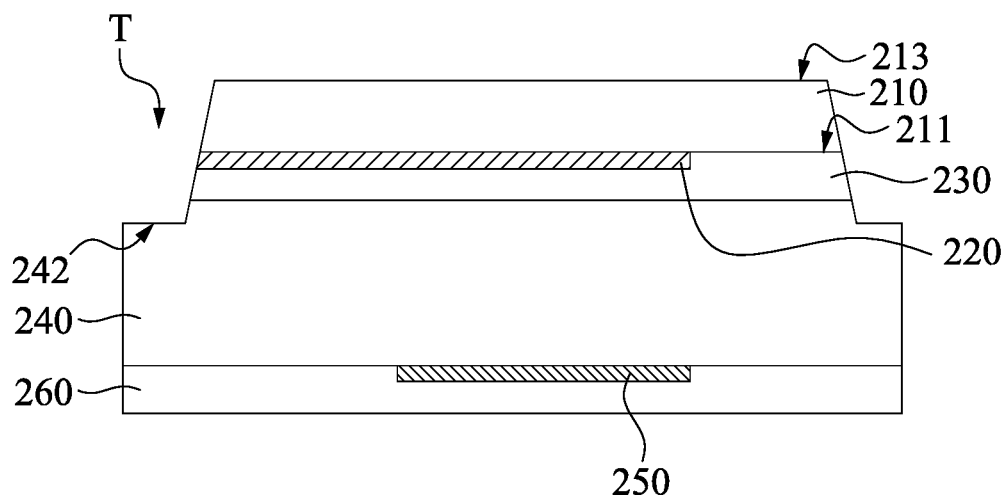

As shown in FIG. 20 and FIG. 21, next, the structure in FIG. 19 may be overturned 180 degrees, and the second surface 213 of the first substrate 210 may be polished to thin the first substrate 210. After the first substrate 210 is thinned, the edge portion of the first substrate 210 and the edge portion of the passivation layer 230 are removed by cutting to form a trench T. In this embodiment, a lateral surface of the antenna layer 220 is exposed from the trench T, and the trench T extends into the second substrate 240 such that the second substrate 240 has a concave portion 242.

Figure 22:
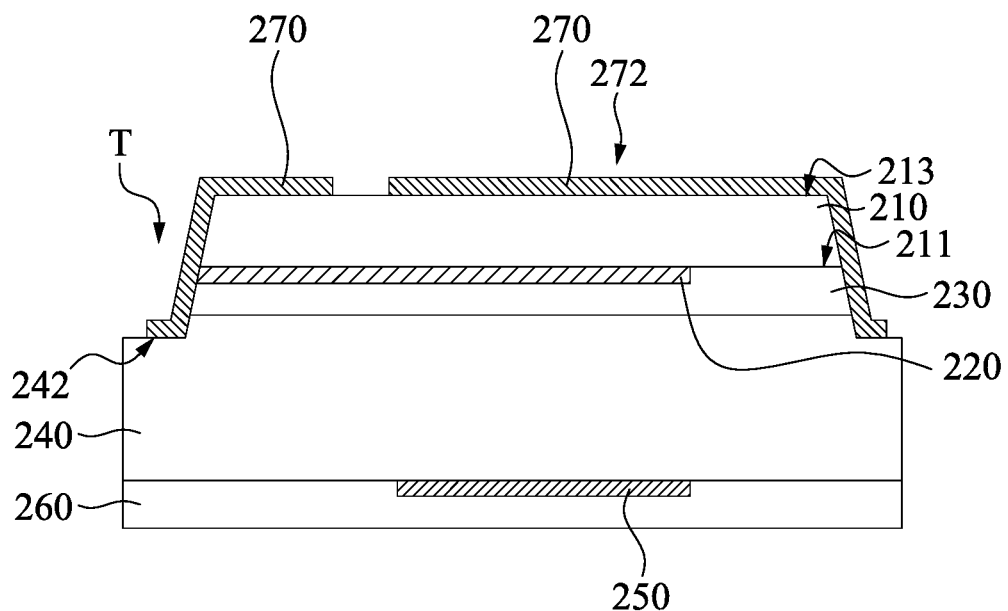

As shown in FIG. 22, next, the redistribution layer 270 is formed on the second surface 213 of the first substrate 210, on the lateral surface of the antenna layer 220, and on the concave portion 242 of the second substrate 240. In this way, the redistribution layer 270 may be electrically connected to the antenna layer 220. In this embodiment, the redistribution layer 270 may be formed by sputtering, and may be made of a material that includes copper. The redistribution layer 270 may be patterned to have a shielding section 272 spaced apart from the antenna layer 220. The shielding section 272 overlaps the antenna layer 220 and has a shielding effect.

Figure 23:
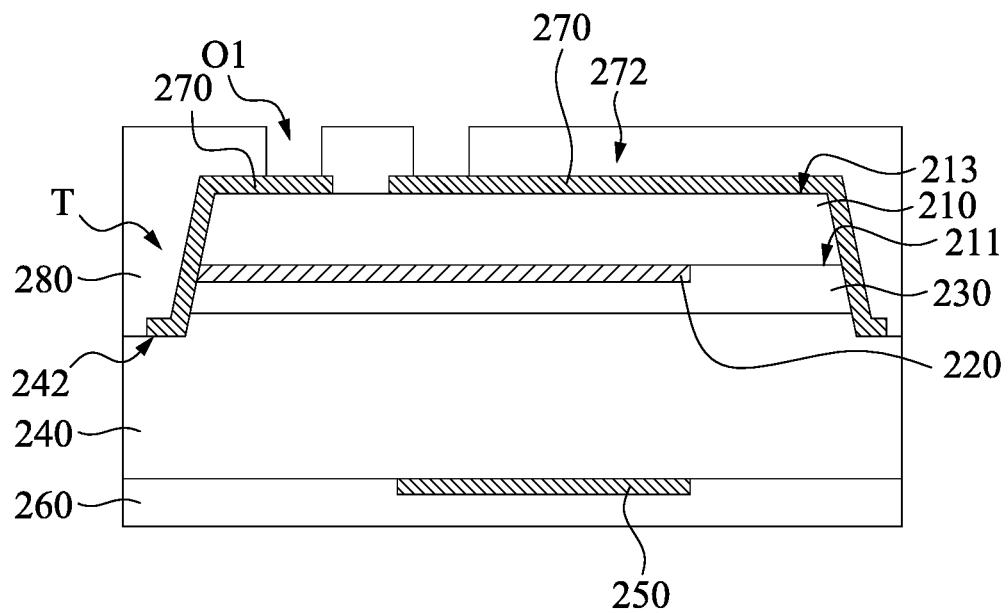
Figure 24:
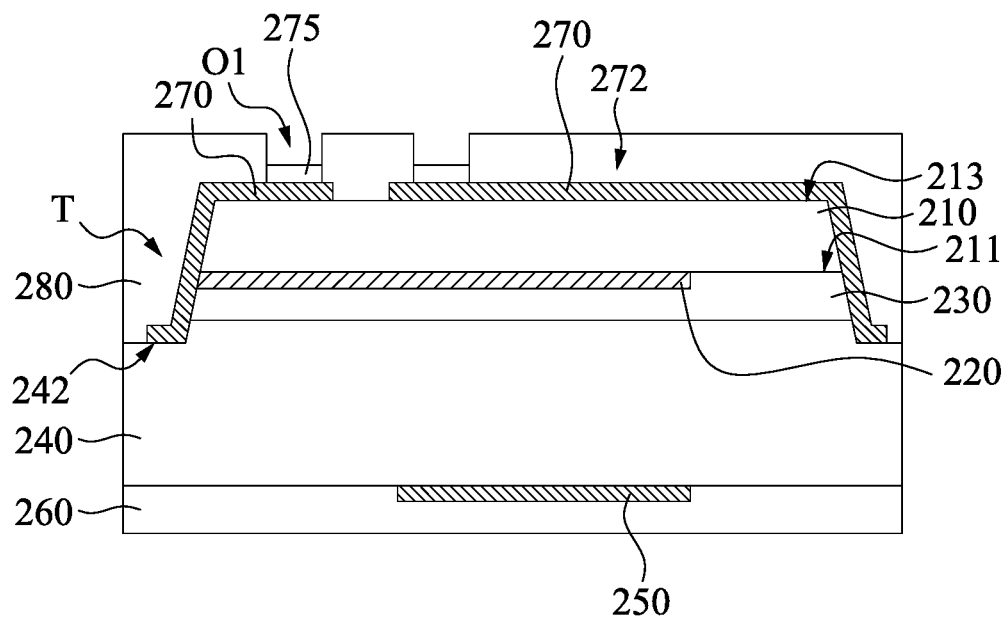

As shown in FIG. 23 and FIG. 24, after the redistribution layer 270 is formed, a passivation layer 280 may be formed to cover the redistribution layer 270. The passivation layer 280 may surround the redistribution layer 270. The passivation layer 280 may be patterned to form an opening O1. Next, a metallic layer 275 (Metal finish) may be selectively formed on the redistribution layer 270 in the opening O1. In some embodiments, the metallic layer 275 can be omitted.

Figure 25:
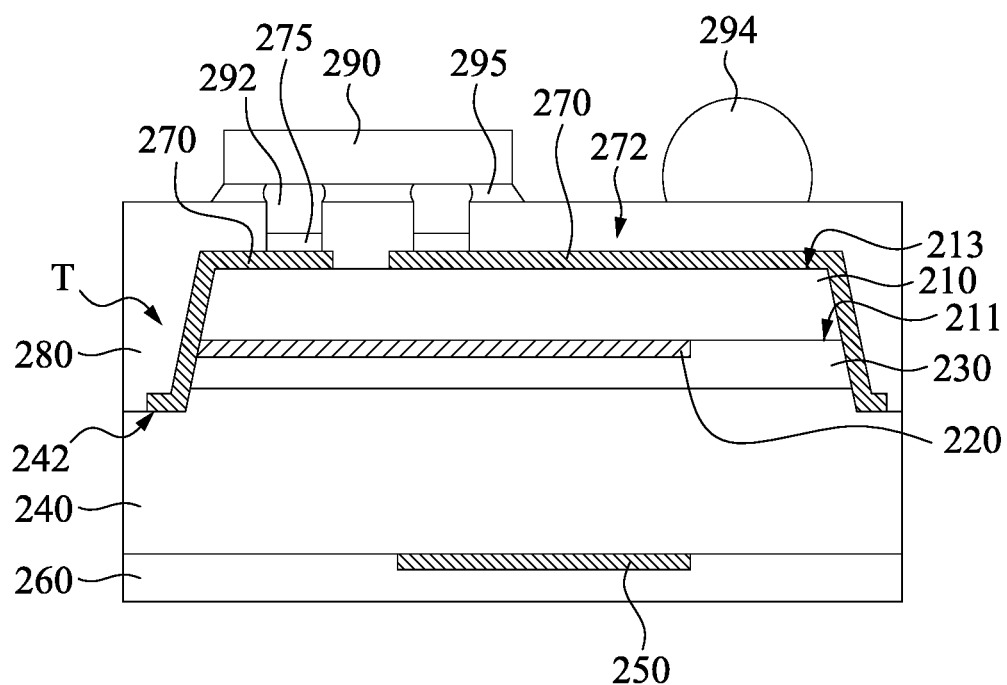

As shown in FIG. 25, a conductive structure 294 may be disposed on the passivation layer 280, and an integrated circuit component 290 having a conductive structure 292 may be disposed on the redistribution layer 270 in the opening O1. The integrated circuit element 290 may be electrically connected to the antenna layer 220 through the conductive structure 292 and the redistribution layer 270, and also may be electrically connected to the shielding section 272 of the redistribution layer 270 through the conductive structure 292. In addition, a filling layer 295 (under fill) may be also disposed between the integrated circuit component 290 and the passivation layer 280 to provide insulated and protective functions. Through the aforementioned processes, the chip package 200 in FIG. 25 may be formed. In one embodiment, the filling layer 295 can be omitted from the chip package 200. In one embodiment, the chip package 200 also can omit the disposition of the integrated circuit component 290.

In this embodiment, the redistribution layer 270 of the chip package 200 extends from the second surface 213 of the first substrate 210 to the lateral surface of the first substrate 210, the lateral surface of the first passivation layer 230 and the concave portion 242 of the second substrate 240. The chip package 200 can provide better performance for millimeter wave (mm-wave) devices, such as shorter transmission lines, the integrated circuit components 290 and the antenna layer 220. And the chip package 200 can use better substrate materials (such as silica glass) to replace the printed circuit board (PCB).

In one embodiment, the antenna layer 220 in FIG. 16 is formed on a surface of the second substrate 240 facing the first passivation layer 230 rather than on the first surface 211 of the first substrate 210. In this way, after performing the processes in FIG. 17 to FIG. 25, the antenna layer 220 in FIG. 25 may be located on the second substrate 240.

It is to be noted that the connection relationship of the aforementioned elements will not be repeated. In the following description, other types of chip structures will be described. A manufacturing method of the chip package will now be described.

Figure 26:
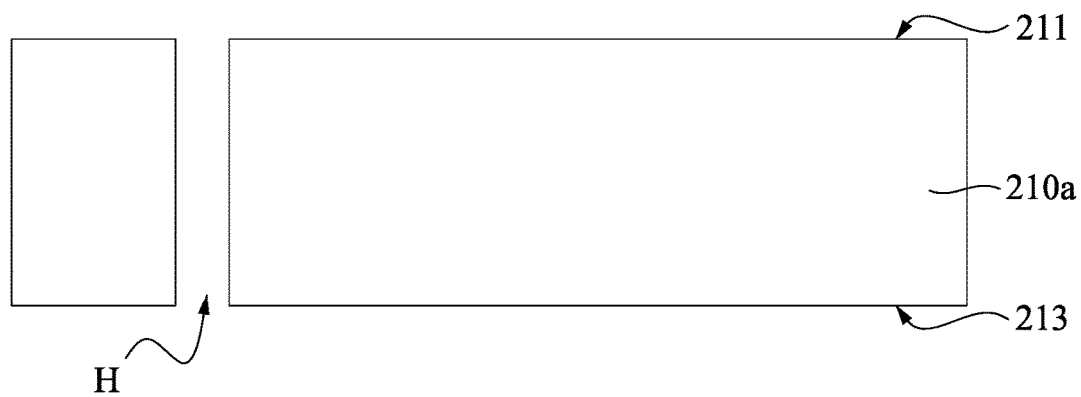
FIG. 26 to FIG. 34 are cross-sectional views at various stages of a manufacturing method of the chip package according to one embodiment of the present invention.
Figure 27:
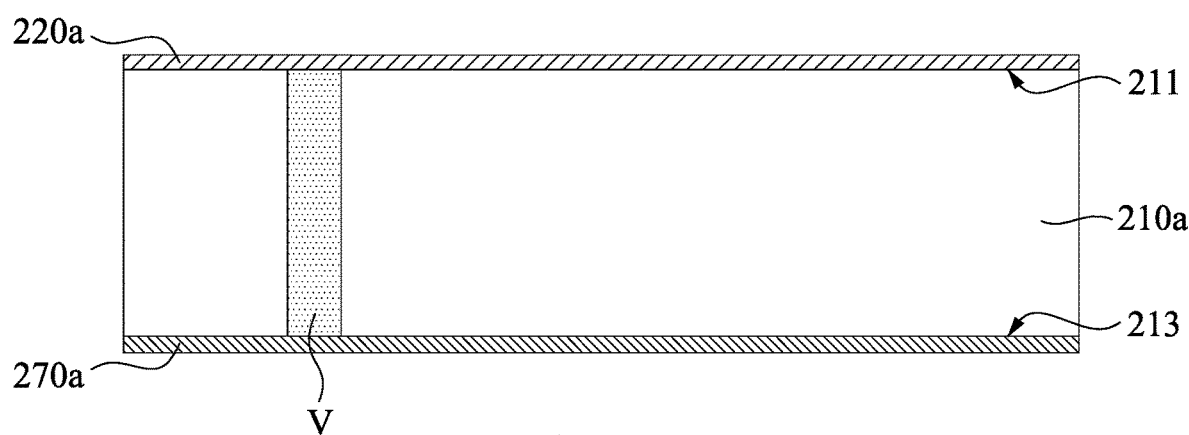

FIG. 26 to FIG. 34 are cross-sectional views at various stages of a manufacturing method of a chip package 200a (see FIG. 34) according to one embodiment of the present invention. As shown in FIG. 26, a hole H is formed into a first substrate 210a. The hole H can be formed by drilling. As shown in FIG. 27, next, the first substrate 210a may be performed by a metallization process to form an antenna layer 220a on the entire first surface 211 of the first substrate 210a, a conductive via V in the first substrate 210a, and a redistribution layer 270a on the entire second surface 213 of the first substrate 210a. In this way, the structure in FIG. 27 is obtained. In this embodiment, the antenna layer 220a, the conductive via V, and the redistribution layer 270a may be integrally formed and made of the same material (e.g., copper), and the present invention is not limited in this regard. The first substrate 210a may be made of a material that includes glass, fused silica or silica glass. The first substrate 210a inside may have no circuits and conductive contacts.

Figure 28:
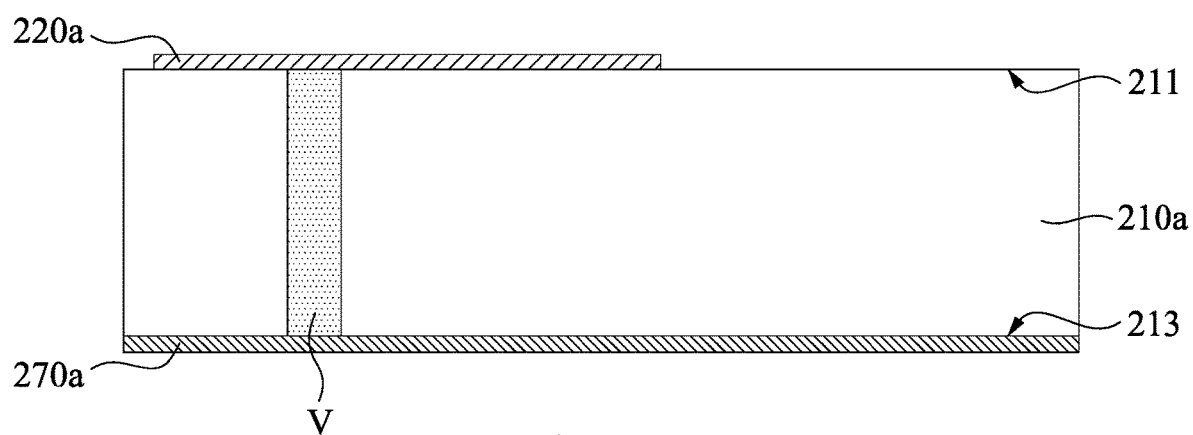
Figure 29:
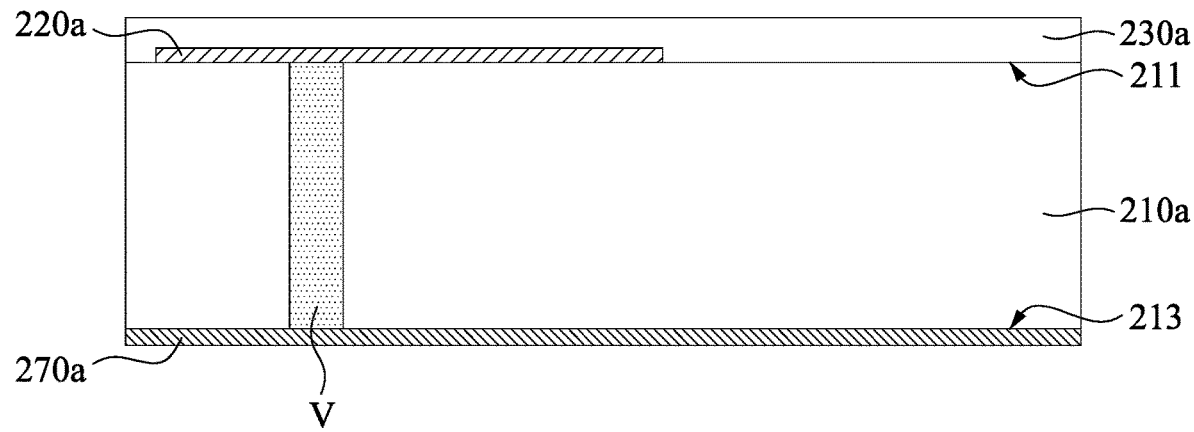

As shown in FIG. 28 and FIG. 29, after performing the metallization process, the antenna layer 220a covering the entire first surface 211 of the first substrate 210a is patterned such that the antenna layer 220a in FIG. 28 is obtained. Next, the passivation layer 230a may be formed to cover the antenna layer 220a.

Figure 30:
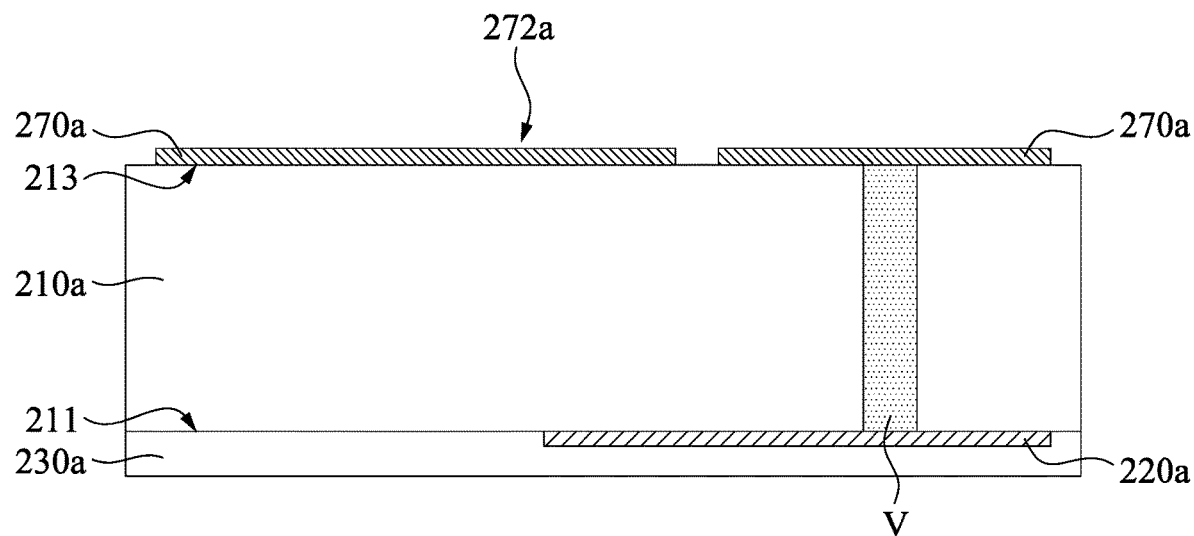
Figure 31:
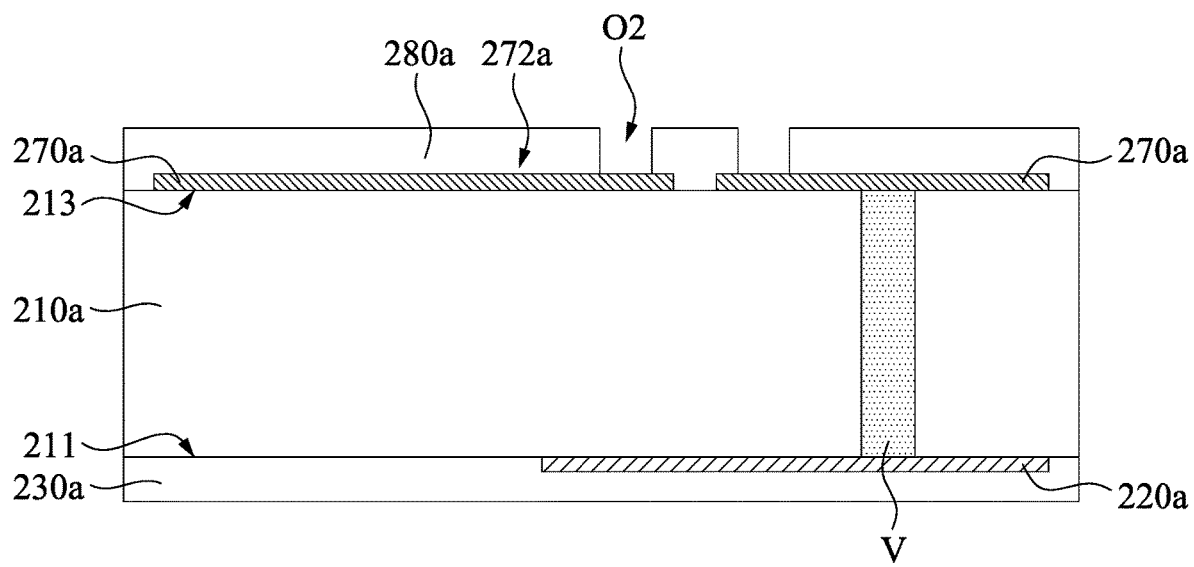

As shown in FIG. 30 and FIG. 31, next, the structure in FIG. 29 may be overturned 180 degrees, and the redistribution layer 270 may be patterned to have a shielding section 272a spaced apart from the conductive via V. The shielding section 272a overlaps the antenna layer 220a and has a shielding effect. After the redistribution layer 270 is patterned, a passivation layer 280a may be formed to cover the redistribution layer 270a. The passivation layer 280 is patterned to form an opening O2.

Figure 32:
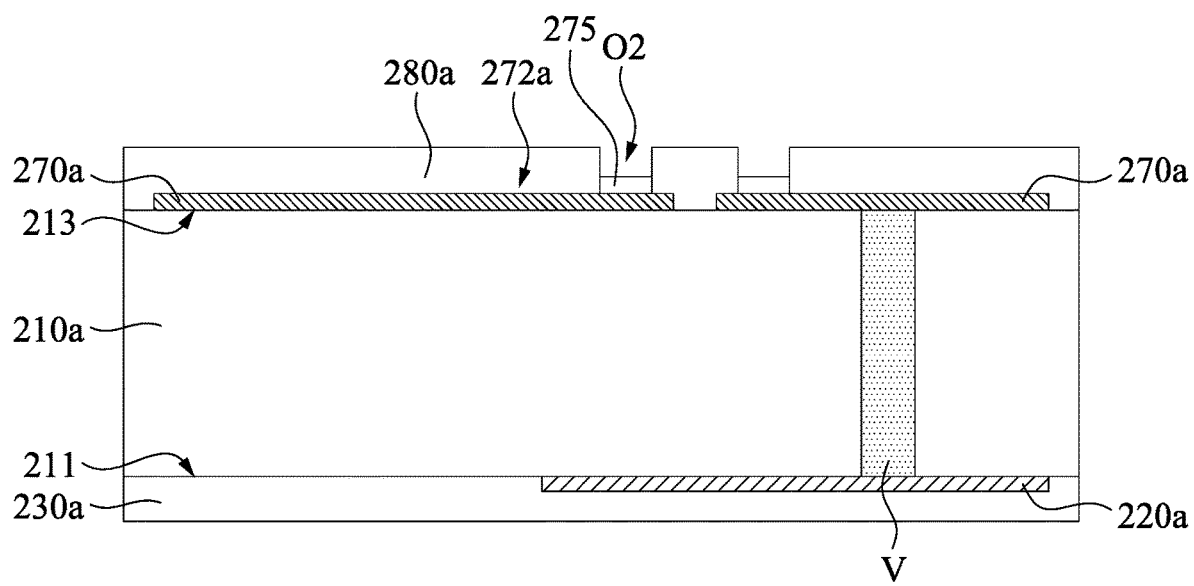
Figure 33:
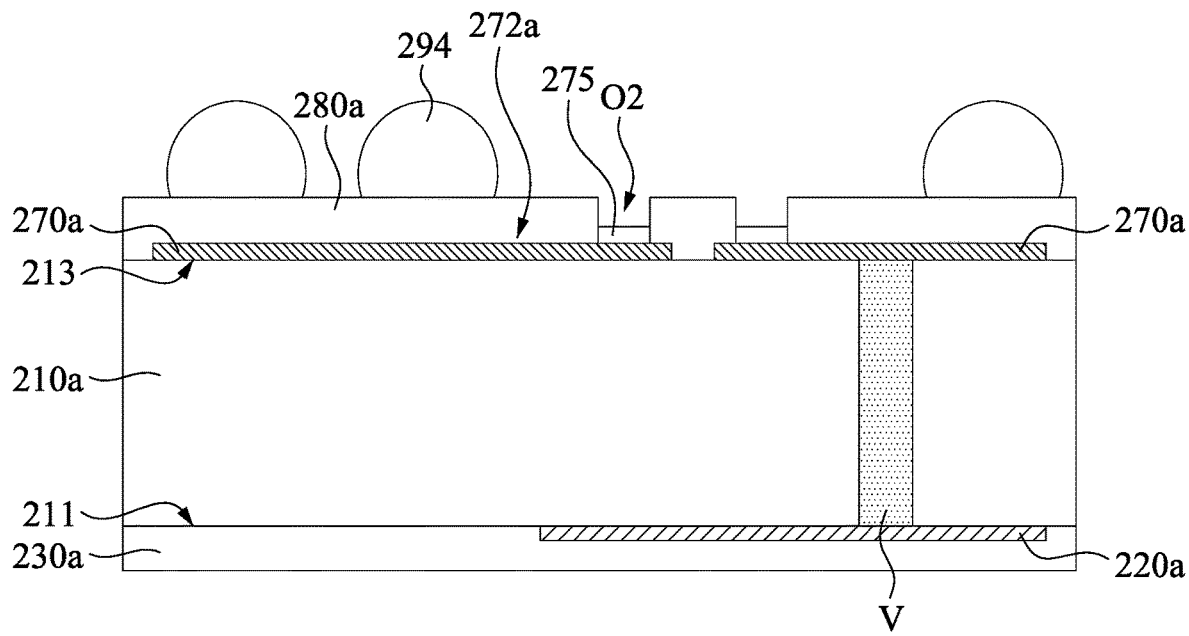

As shown in FIG. 32 and FIG. 33, next, the metallic layer 275 (Metal finish) may be selectively formed on the redistribution layer 270a in the opening O2. In some embodiments, the metallic layer 275 can be omitted. After the metallic layer 275 is formed, the conductive structure 294 may be disposed on the passivation layer 280a.

Figure 34:
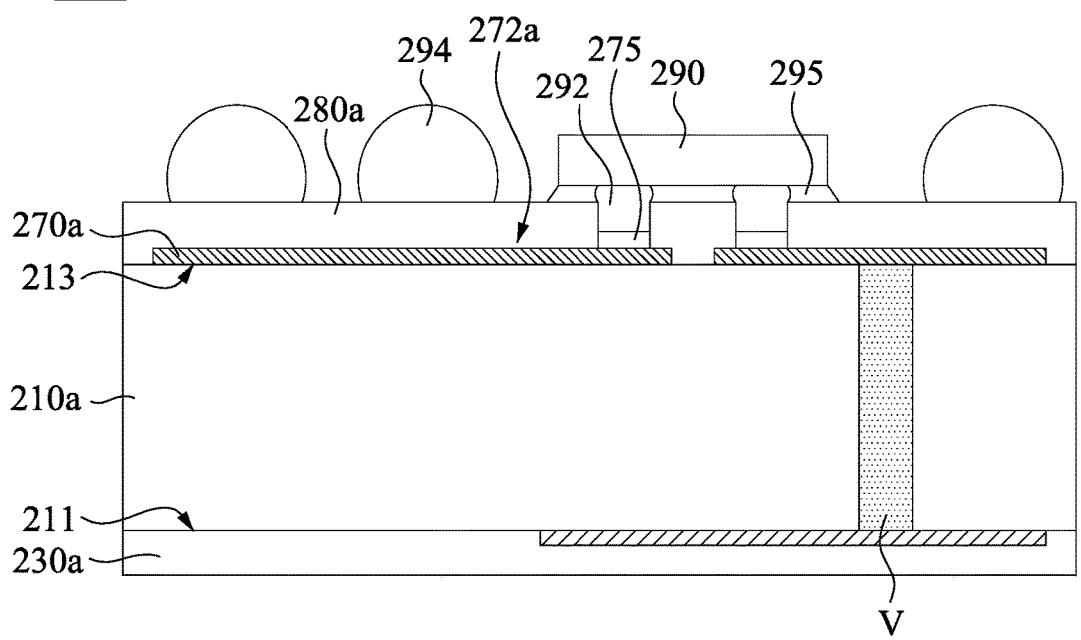

As shown in FIG. 34, after the conductive structure 294 is disposed, the integrated circuit component 290 having a conductive structure 292 may be disposed on the redistribution layer 270a in the opening O2. The integrated circuit component 290 may be electrically connected to the antenna layer 220 through the conductive structure 292, the redistribution layer 270a and the conductive via V. The integrated circuit component 290 also may be electrically connected to the shielding section 272a of the redistribution layer 270a through the conductive structure 292. Both ends of the conductive via V may be respectively in contact with the antenna layer 220a and the redistribution layer 270a. In addition, a filling layer 295 (under fill) also may be disposed between the integrated circuit component 290 and the passivation layer 280 to provide insulated and protective functions. Through the aforementioned processes, the chip package 200a in FIG. 34 is formed. In one embodiment, the filling layer 295 can be omitted from the chip package 200a. In one embodiment, the chip package 200a also can omit the disposition of the integrated circuit component 290.

In this embodiment, the redistribution layer 270a of the chip package 200a may be electrically connected to the antenna layer 220a of the first surface 211 of the first substrate 210 through the conductive via V. The chip package 200a can provide better performance for millimeter wave (mm-wave) devices, such as shorter transmission lines, the integrated circuit components 290 and the antenna layer 220. And the chip package 200a can use better substrate materials (such as silica glass) to replace the printed circuit board (PCB).

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing form the scope or spirit of the invention. In view of the foregoing, it is intended that the present invention covers modifications and variations of this invention provided they fall within the scope of the following claims.

What is claimed is:

1. A chip package, comprising:
    a semiconductor substrate having an inclined sidewall and a conductive pad protruding from the inclined sidewall;
    a supporting element located on the semiconductor substrate, and having a top surface facing away from the semiconductor substrate and an inclined sidewall adjacent to the top surface;
    an antenna layer located on the top surface of the supporting element;
    a redistribution layer located on the inclined sidewall of the supporting element, and being in contact with a sidewall of the conductive pad and an end of the antenna layer; and
    a protective layer covering the supporting element, the antenna layer, and an end of the redistribution layer facing away from the semiconductor substrate, wherein the protective layer is made of a material that comprises glass, fused silica, silica glass, sapphire, or combinations thereof.

2. The chip package of claim 1, further comprising:
    a shielding layer between the semiconductor substrate and the supporting element.

3. The chip package of claim 2, wherein the supporting element has a bottom surface opposite to the top surface, and the shielding layer is in contact with the bottom surface.

4. The chip package of claim 1, wherein the antenna layer is in contact with the top surface of the supporting element.

5. The chip package of claim 1, wherein the semiconductor substrate has a bottom surface adjacent to the inclined sidewall, and the chip package further comprises:
    a planarization layer covering the inclined sidewall and the bottom surface of the semiconductor substrate, and covering a bottom surface of the conductive pad, and having a bottom surface and an inclined sidewall adjacent to the bottom surface, and a slope of the inclined sidewall of the planarization layer is substantially equal to a slope of the inclined sidewall of the supporting element.

6. The chip package of claim 5, wherein the redistribution layer is located on the inclined sidewall and the bottom surface of the planarization layer.

7. The chip package of claim 1, wherein transmission frequency of the antenna layer is in range from 20 GHz to 60 GHz, and the semiconductor substrate is a radio frequency device.

8. The chip package of claim 1, wherein the protective layer is adhesive.

9. The chip package of claim 1, wherein a cavity is formed among the supporting element, the semiconductor substrate, and the protective layer, and the supporting element surrounds the cavity.

10. The chip package of claim 1, wherein the semiconductor substrate has a top surface adjacent to the inclined sidewall of the semiconductor substrate, the chip package further comprising:
    a shielding layer located on the top surface of the semiconductor surface.

11. The chip package of claim 1, further comprising:
    a bonding layer between the supporting element and the semiconductor substrate.

12. A manufacturing method of a chip package, comprising:
    forming an antenna layer on a top surface of a supporting element;
    bonding the supporting element to a top surface of a semiconductor substrate, wherein the top surface of the semiconductor has a conductive pad and the top surface of the supporting element faces away from the semiconductor substrate;
    disposing a protective layer on the supporting element and the antenna layer, wherein the protective layer is made of a material that comprises glass, fused silica, silica glass, sapphire, or combinations thereof;
    etching a bottom surface of the semiconductor substrate such that the semiconductor substrate has an inclined sidewall, and the conductive pad protrudes from the inclined sidewall;
    performing a cutting process such that the supporting element has an inclined sidewall adjacent to the top surface of the supporting element; and
    forming a redistribution layer on the inclined sidewall of the supporting element such that the redistribution layer is in contact with a sidewall of the conductive pad and an end of the antenna layer,
    wherein the protective layer covers the supporting element, the antenna layer, and an end of the redistribution layer facing away from the semiconductor substrate.

13. The manufacturing method of the chip package of claim 12, wherein forming the antenna layer comprises:
   sputtering a conductive layer on the top surface of the supporting element; and
   patterning the conductive layer to form the antenna layer.

14. The manufacturing method of the chip package of claim 12, further comprising:
   forming a shielding layer on a bottom surface of the supporting element.

15. The manufacturing method of the chip package of claim 14, wherein forming the shielding layer comprises:
   sputtering a conductive layer on the bottom surface of the supporting element; and
   patterning the conductive layer to form the shielding layer.

16. The manufacturing method of the chip package of claim 12, further comprising:
   forming a planarization layer on the inclined sidewall and the bottom surface of the semiconductor substrate and a bottom surface of the conductive pad.

17. The manufacturing method of the chip package of claim 16, wherein the cutting process is performed such that the planarization layer simultaneously forms an inclined sidewall, wherein a slope of the inclined sidewall of the planarization layer is substantially equal to a slope of the inclined sidewall of the supporting element.

18. A chip package, comprising:
   a first substrate having a first surface and a second surface opposite to the first surface;
   an antenna layer located on the first surface of the first substrate;
   a first passivation layer covering the antenna layer; and
   a redistribution layer located on the second surface of the first substrate, and electrically connected to the antenna layer, wherein the redistribution layer further has a shielding section spaced apart from the antenna layer, and the shielding section overlaps the antenna layer.

19. The chip package of claim 18, wherein the redistribution layer extends to a lateral surface of the first substrate and a lateral surface of the first passivation layer.

20. The chip package of claim 18, further comprising:
   a second substrate, wherein the first passivation layer is between the first substrate and the second substrate, and the redistribution layer extends to a concave portion of the second substrate.

21. The chip package of claim 20, further comprising:
   a metallic layer located on a surface of the second substrate facing away from the first passivation layer; and
   a second passivation layer covering the metallic layer.

22. The chip package of claim 20, wherein the second substrate is made of a material that comprises glass, fused silica or silica glass.

23. The chip package of claim 18, further comprising:
   a second passivation layer covering the redistribution layer.

24. The chip package of claim 23, further comprising:
   an integrated circuit component having a conductive structure located on the redistribution layer.

25. The chip package of claim 18, wherein the first substrate is made of a material that comprises glass, fused silica or silica glass.

26. The chip package of claim 18, further comprising:
   a conductive via located in the first substrate, wherein two ends of the conductive via are respectively in contact with the antenna layer and the redistribution layer.

27. A manufacturing method of a chip package, comprising:
   forming an antenna layer on a first surface of a first substrate, wherein the first substrate has a second surface opposite to the first surface;
   forming a first passivation layer covering the antenna layer; and
   forming a redistribution layer on the second surface of the first substrate, wherein the redistribution layer is electrically connected to the antenna layer, the redistribution layer has a shielding section spaced apart from the antenna layer, and the shielding section overlaps the antenna layer.

28. The manufacturing method of the chip package of claim 27, further comprising:
   bonding a second substrate to the first substrate such that the first passivation layer is between the first substrate and the second substrate.

29. The manufacturing method of the chip package of claim 28, further comprising:
   forming a metallic layer on a surface of the second substrate facing away from the first passivation layer; and
   forming a second passivation layer to cover the metallic layer.

30. The manufacturing method of the chip package of claim 28, further comprising:
   removing an edge portion of the first substrate and an edge portion of the first passivation layer to form a trench, wherein a lateral surface of the antenna layer is exposed from the trench, and the trench extends into the second substrate such that the second substrate has a concave portion.

31. The manufacturing method of the chip package of claim 30, wherein forming the redistribution layer on the second surface of the first substrate further comprises:
   forming the redistribution layer on the lateral surface of the antenna layer and the concave portion of the second substrate.

32. The manufacturing method of the chip package of claim 27, further comprising:
   forming a second passivation layer to cover the redistribution layer.

33. The manufacturing method of the chip package of claim 27, further comprising:
   disposing an integrated circuit component on the redistribution layer, wherein the integrated circuit component has a conductive structure.

34. The manufacturing method of the chip package of claim 27, further comprising:
   forming a conductive via in the first substrate, wherein two ends of the conductive via are respectively in contact with the antenna layer and the redistribution layer.

* * * * *